US008355562B2

(12) United States Patent
Toyoda et al.

(10) Patent No.: US 8,355,562 B2
(45) Date of Patent: Jan. 15, 2013

(54) PATTERN SHAPE EVALUATION METHOD

(75) Inventors: Yasutaka Toyoda, Hitachi (JP); Ryoichi Matsuoka, Yotsukaido (JP); Akiyuki Sugiyama, Hitachinaka (JP)

(73) Assignee: Hitachi High-Technologies Corporation, Tokyo (JP)

( * ) Notice: Subject to any disclaimer, the term of this patent is extended or adjusted under 35 U.S.C. 154(b) by 1186 days.

(21) Appl. No.: 12/192,317

(22) Filed: Aug. 15, 2008

(65) Prior Publication Data
US 2009/0052765 A1 Feb. 26, 2009

(30) Foreign Application Priority Data

Aug. 23, 2007 (JP) ................................ 2007-216576
May 30, 2008 (JP) ................................ 2008-141828

(51) Int. Cl.
*G06K 9/00* (2006.01)

(52) U.S. Cl. ...................................... 382/149; 382/147

(58) Field of Classification Search .................. None
See application file for complete search history.

(56) References Cited

U.S. PATENT DOCUMENTS

| 7,365,322 | B2 | 4/2008 | Miyamoto et al. |
| 2001/0030300 | A1* | 10/2001 | Shishido et al. ......... 250/559.44 |
| 2002/0063893 | A1* | 5/2002 | Fujieda ........................ 358/1.15 |
| 2005/0238221 | A1* | 10/2005 | Hirano et al. ................. 382/144 |
| 2006/0045326 | A1* | 3/2006 | Toyoda et al. ................ 382/145 |
| 2006/0288325 | A1 | 12/2006 | Miyamoto et al. |
| 2007/0023653 | A1 | 2/2007 | Toyoda et al. |
| 2007/0098248 | A1 | 5/2007 | Toyoda et al. |
| 2007/0210252 | A1 | 9/2007 | Miyamoto et al. |

FOREIGN PATENT DOCUMENTS

JP  2001-338304  12/2001

* cited by examiner

*Primary Examiner* — Gregory J Toatley
*Assistant Examiner* — Juan D Valentin, II
(74) *Attorney, Agent, or Firm* — McDermott Will & Emery LLP

(57) ABSTRACT

A pattern shape evaluation method and semiconductor inspection system having a unit for extracting contour data of a pattern from an image obtained by photographing a semiconductor pattern, a unit for generating pattern direction data from design data of the semiconductor pattern, and a unit for detecting a defect of a pattern, through comparison between pattern direction data obtained from the contour data and pattern direction data generated from the design data corresponding to a pattern position of the contour data.

19 Claims, 29 Drawing Sheets

FIG. 7

| CONTOUR PIXELS AT 0° | | | CONTOUR PIXELS AT 90° | | | CONTOUR PIELS AT 45° | | |
|---|---|---|---|---|---|---|---|---|
| 0 | 0 | 0 | 0 | 1 | 0 | 0 | 0 | 1 |
| 1 | 1 | 1 | 0 | 1 | 0 | 0 | 1 | 0 |
| 0 | 0 | 0 | 0 | 1 | 0 | 1 | 0 | 0 |

FIG. 8

| | TEMPLATE No. | | | | | | | | | | | | |
|---|---|---|---|---|---|---|---|---|---|---|---|---|---|
| CONTOUR DIRECTION | 1 | 2 | 3 | 4 | 5 | 6 | 7 | 8 | 9 | 10 | 11 | 12 | 13 |
| 0° | 6 | 3 | 3 | 0 | 3 | 0 | 0 | 0 | 0 | 0 | 0 | 3 | 3 |
| 90° | 0 | 0 | 0 | 0 | 3 | 3 | 3 | 6 | 3 | 3 | 0 | 3 | 0 |
| 45° | 0 | 3 | 3 | 6 | 0 | 0 | 0 | 0 | 0 | 0 | 0 | 0 | 0 |

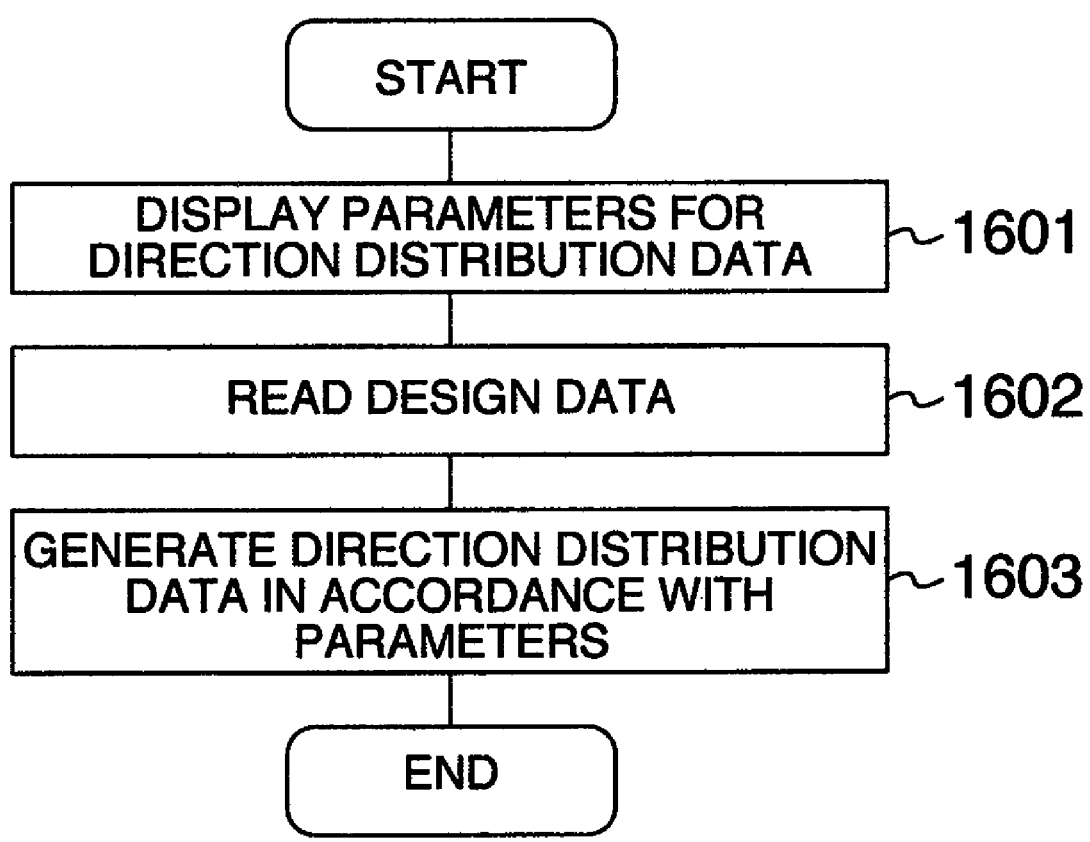

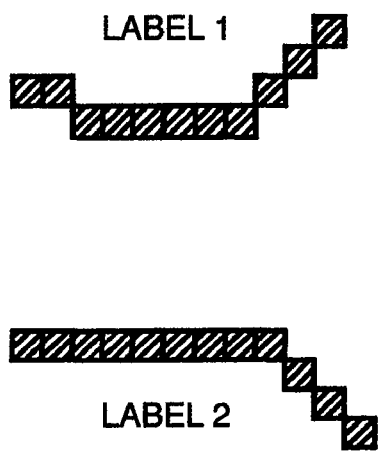
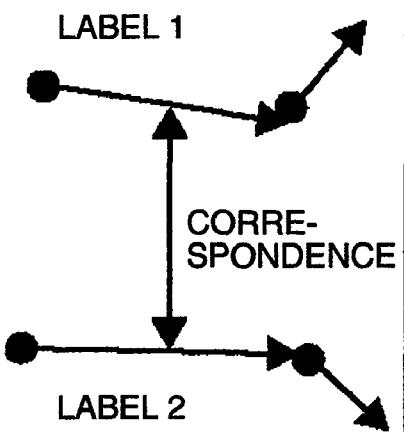
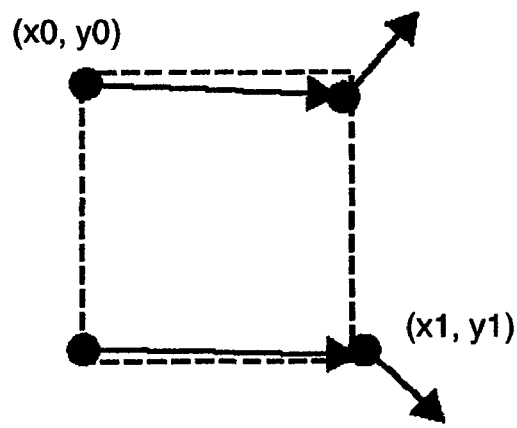

| LINE SEGMENT NO. | LINE SEGMENT LENGTH | NUMBER OF EDGES COUNTED IN NORMAL AREA | CORRUPT |
|---|---|---|---|
| (1) | L1 | EL1 | ABSENT |
| (2) | L2 | EL2 | ABSENT |
| (3) | L3 | EL3 | PRESENT |
| (4) | L4 | EL4 | ABSENT |

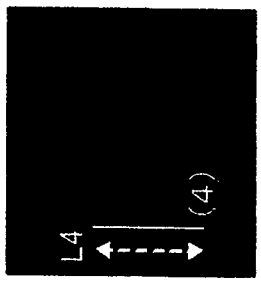
FIG. 24A-4
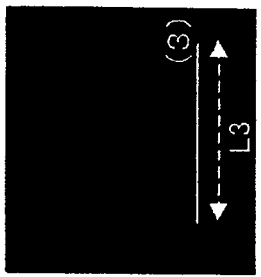
FIG. 24A-3
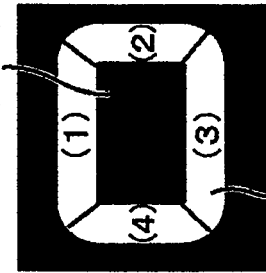
FIG. 24D
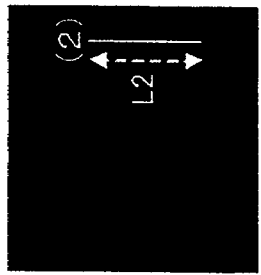
FIG. 24A-2
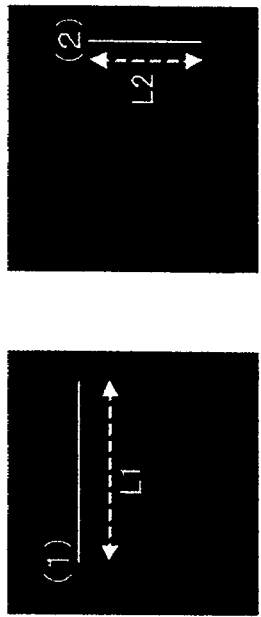
FIG. 24A-1
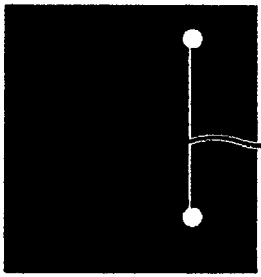
FIG. 24C
FIG. 24A
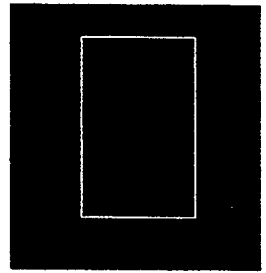
FIG. 24B 2502
2501
FIG. 25A-1 (0°~45°, 135°~180°) 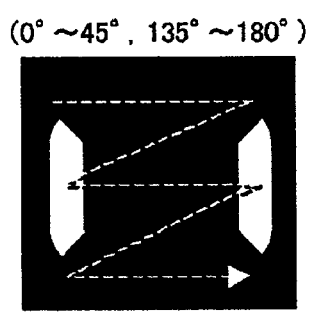
FIG. 25A-2 (46°~134°) 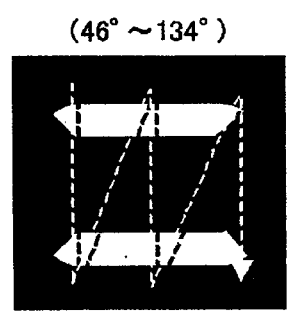

FIG. 26B

PATTERN SHAPE EVALUATION METHOD

BACKGROUND OF THE INVENTION

1. Field of the Invention

The present invention relates to a pattern shape evaluation method of inspecting a pattern formed on a photomask or wafer by using an image obtained by photographing a semiconductor device and design data of the semiconductor device, a pattern shape evaluation device, and a semiconductor inspection system using the method and device.

2. Description of the Related Art

In recent years, there have been situations where manufacture of semiconductor devices is difficult because of miniaturization and multilayering thereof have been progressed and because logic thereof has been more complicated. As a result, there has been a tendency that defects to be attributed to manufacturing processes occur frequently, and it has been important to detect detects efficiently and accurately and identify problems of manufacturing processes.

The defects to be attributed to manufacturing processes include a deformed pattern, a broken pattern, a shorted pattern and the like, and these defects can be detected through comparison with a standard pattern having an ideal shape. More specifically, an operator selects a pattern having an ideal shape from patterns formed on a photomask or wafer, and the selected pattern is photographed to visualize it (i.e., to use it as a standard image). Next, a pattern of an inspection object is photographed, positions of the inspection object image pattern and standard image pattern are adjusted and a difference calculation is performed. If the inspection object image pattern contains a defect, luminance information on a defect position becomes different from that of the standard image at a corresponding position, and a difference amount becomes large. By using this phenomenon, a position having a difference value not smaller than a predetermined value is detected as a defect position.

With this inspection approach, however, since an operator is required to perform a registration work for the standard pattern, there arises a problem that the standard pattern registration work takes a long time if patterns of various shapes are to be inspected. To solve this problem, it has been tried to shorten an inspection time by automating the registration work by detecting a defect through comparison between a design pattern and an inspection pattern by using as the standard pattern the design pattern of a semiconductor device. Detecting a defect through comparison between a design pattern and an inspection pattern is disclosed in Japanese Patent Publication 2001-338304. The Publication discloses the contents that design data is changed to a shape estimated to be actually formed in an inspection object pattern, this shape is photographed, edges of the design data and an inspection object pattern are correlated to each other if a direction and an inter-edge distance of edges of the inspection object pattern existing along a normal direction of each edge of the design pattern are in a predetermined range, and edges of the inspection design pattern not correlated to those of the design pattern are detected as defects.

SUMMARY OF THE INVENTION

With this method of searching edges of the inspection object pattern in one direction using each edge of the design pattern as a judgment criterion, however, if a pattern shape is deformed more or less relative to the design data, a pattern area may exist which is difficult to be correlated to the design data, resulting in a problem of erroneously detecting a normal pattern area as a defect. Further, if a correlating direction range is broadened, it takes a time to search edges.

In view of these issues, the present invention provides a pattern shape evaluation method capable of reducing erroneous judgments of normal pattern areas which have been the problems of conventional techniques, and detecting a pattern defect position at high speed by simplifying the process sequence, a pattern shape evaluation device, a pattern shape evaluation data generation device, and a semiconductor shape evaluation system using the same.

In order to settle the above-described issues, the present invention provides a pattern shape evaluation method comprising steps of: extracting contour data of a pattern from an image obtained by photographing a circuit pattern of an electronic device; generating direction data of the pattern, in accordance with pattern shape data extracted from design data of the electronic device; and detecting a defect of the pattern through comparison between direction data of the pattern obtained from the contour data, and direction data of the pattern generated from the contour data of the pattern extracted from the design data corresponding to a pattern position of the contour data.

In order to settle the above-described issues, the present invention provides a pattern shape evaluation method comprising steps of: extracting contour data of a pattern from an image obtained by photographing a circuit pattern of an electronic device; generating shape range data of the pattern, in accordance with pattern shape data extracted from design data of the electronic device; and detecting a defect of the pattern through comparison with the shape range data of the pattern extracted from the pattern shape data extracted from the design data corresponding to a pattern position of the contour data.

In order to settle the above-described issues, the present invention provides a pattern shape evaluation method comprising steps of: extracting contour data of a pattern from an image obtained by photographing a circuit pattern of an electronic device; generating pattern direction data and pattern shape range data, in accordance with pattern shape data extracted from design data of the electronic device; and detecting a defect of the pattern through comparison between direction data of the pattern obtained from the contour data, and the pattern direction data and the pattern shape range data generated from the pattern shape data extracted from the design data corresponding to a pattern position of the contour data.

In order to settle the above-described issues, in the pattern shape evaluation method of the present invention, when the contour data of the pattern is extracted from the image, contour pixels of the pattern are detected from the image in a pixel unit, and new contour pixels obtained through an approximation process for adjacent contour pixels are used as the contour data.

In order to settle the above-described issues, in the pattern shape evaluation method of the present invention, wherein when a defect of the pattern is to be detected, the pattern direction data of the contour data is compared with the pattern direction data generated from the design data corresponding to the pattern position, and a contour data area having a difference value obtained from the two sets of pattern direction data outside a rated range is judged as a defect.

In order to settle the above-described issues, in the pattern shape evaluation method of the present invention, when a defect of the pattern is to be detected, a pattern position of the contour data is compared with the pattern shape range data generated from the design data corresponding to the pattern position, and if the pattern position of the contour data is outside the pattern shape range, a contour data area is judged as a defect.

In order to settle the above-described issues, in the pattern shape evaluation method of the present invention, the pattern direction data includes pattern direction range data, and when a defect of the pattern is to be detected and if the pattern direction data of the contour data is outside the pattern direction range, a contour data area is judged as a defect.

In order to settle the above-described issues, in the pattern shape evaluation method of the present invention, a defect having a continuous contour is detected from each pattern defect, and an area containing the defect having the continuous contour is detected as defect area data.

In order to settle the above-described issues, the pattern shape evaluation method of the present invention further comprises a unit for detecting a contour having an opposing relation from each pattern defect, and detecting an area including the contour having the opposing relation as defect area data.

In order to settle the above-described issues, in the pattern shape evaluation method of the present invention, a defect type of the defect area data is judged from a state of the pattern of the design data at a position of the defect area data.

In order to settle the above-described issues, the present invention provides a pattern shape evaluation device comprising: means for extracting contour data of a pattern from an image obtained by photographing a circuit pattern of an electronic device; means for generating direction data of the pattern, in accordance with pattern shape data extracted from design data of the electronic device; and means for detecting a defect of the pattern through comparison between direction data of the pattern obtained from the contour data, and direction data of the pattern generated from the contour data of the pattern extracted from the design data corresponding to a pattern position of the contour data.

In order to settle the above-described issues, the present invention provides a pattern shape evaluation device comprising: means for extracting contour data of a pattern from an image obtained by photographing a circuit pattern of an electronic device; means for generating shape range data of the pattern, in accordance with pattern shape data extracted from design data of the electronic device; and means for detecting a defect of the pattern through comparison with the shape range data of the pattern extracted from the pattern shape data extracted from the design data corresponding to a pattern position of the contour data.

In order to settle the above-described issues, the present invention provides a pattern shape device comprising: means for extracting contour data of a pattern from an image obtained by photographing a circuit pattern of an electronic device; means for generating pattern direction data and pattern shape range data, in accordance with pattern shape data extracted from design data of the electronic device; and means for detecting a defect of the pattern through comparison between direction data of the pattern obtained from the contour data, and the pattern direction data and the pattern shape range data generated from the pattern shape data extracted from the design data corresponding to a pattern position of the contour data.

In order to settle the above-described issues, the present invention provides a pattern shape evaluation data generation device comprising: means for generating pattern shape range data from semiconductor design data; means for displaying the pattern shape range data; means for inputting data regarding a change in the pattern shape range data; and means for updating the pattern shape range data in accordance with the data regarding a change.

In order to settle the above-described issues, the present invention provides a pattern shape evaluation data generation device comprising: means for generating pattern direction data from semiconductor design data; means for displaying the pattern direction data; means for inputting data regarding a change in the pattern direction data; and means for updating the pattern direction data in accordance with the data regarding a change.

In order to settle the above-described issues, the present invention provides a pattern shape evaluation data generation device comprising: means for generating pattern direction data and pattern shape range data from semiconductor design data; means for displaying the pattern direction data and the pattern shape range data; means for inputting data regarding a change in the pattern direction data and the pattern shape range data; and means for updating the pattern direction data and the pattern shape range data in accordance with the data regarding a change.

In order to settle the above-described issues, the pattern shape evaluation data generation device further comprises: means for inputting a parameter of data representative of any one of a pattern width, a pattern direction, a diameter or radius of a circle pattern for forming a curve pattern, and a positional relation of apex coordinate circle patterns of the design data, to the pattern of the design data; and means for generating the pattern shape range data from the design data by using the parameter.

In order to settle the above-described issues, the pattern shape evaluation data generation device further comprises: means for inputting a parameter of data representative of any one of a pattern width, a pattern direction, a diameter or radius of a circle pattern for forming a curve pattern, and a positional relation of apex coordinate circle patterns of the design data, to the pattern of the design data; and means for generating the pattern direction data from the design data by using the parameter.

In order to settle the above-described issues, the pattern shape evaluation data generation device further comprises: means for inputting a parameter of data representative of any one of a pattern width, a pattern direction, a diameter or radius of a circle pattern for forming a curve pattern, and a positional relation of apex coordinate circle patterns of the design data, to the pattern of the design data; and means for generating the pattern direction data and the pattern shape range data by using the parameter.

In order to settle the above-described issues, the present invention provides a semiconductor inspection system comprising a computer equipped with a scanning electron microscope and control means for the scanning electron microscope.

In order to settle the above-described issues, in the pattern shape evaluation device, the pattern direction range data takes a different value depending upon a pattern area.

As described above, according to the present invention, it is possible to reduce erroneous judgments of normal pattern areas which have been the problems of conventional techniques and to detect a pattern defect position at high speed by simplifying the process sequence, through comparison between contour data extracted from image data and direction distribution data representative of a pattern direction and tolerance range using design data as a criterion.

BRIEF DESCRIPTION OF THE DRAWINGS

FIG. 7 is a diagram showing patterns of contour data.

FIG. 8 is a diagram showing template processing results.

FIG. 16 is a flow chart illustrating the direction distribution generation sequence according to the third embodiment.

FIGS. 20A to 20C are diagrams illustrating the defect judgment according to the fourth embodiment of the present invention.

FIG. 22 is a diagram showing a template group to be used for calculating a pattern direction value of contour data.

FIG. 23 is a table to be used for judgment of a corrupt pattern.

FIGS. 24A to 24D are diagrams illustrating a first detection method for a corrupt pattern.

FIGS. 25A to 25A-2 are diagrams illustrating a second detection method for a corrupt pattern.

FIGS. 26A to 26C are diagrams illustrating the details of the second detection method for a corrupt pattern.

DESCRIPTION OF THE EMBODIMENTS

Embodiments of the present invention will be described with reference to the accompanying drawings.

(1) First Embodiment

Figure 1:
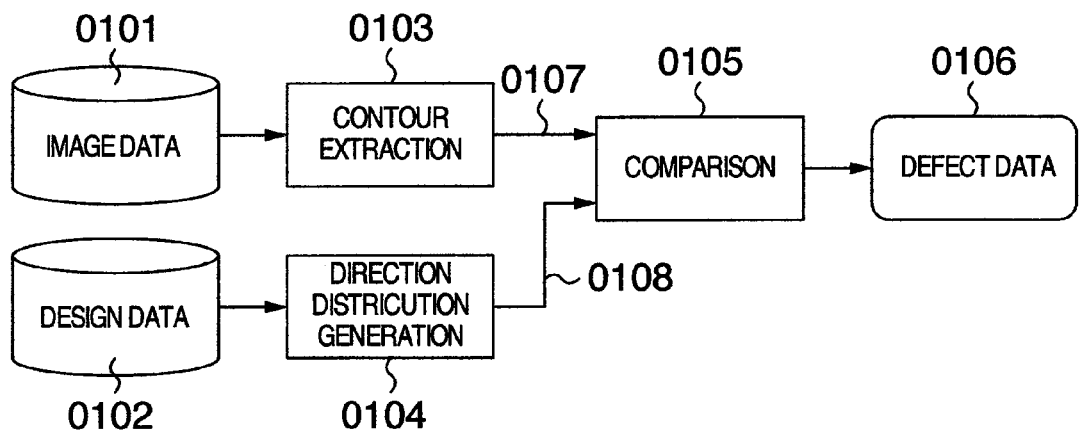
FIG. 1 is a block diagram illustrating a pattern shape evaluation method according to a first embodiment of the present invention.
Figure 4:
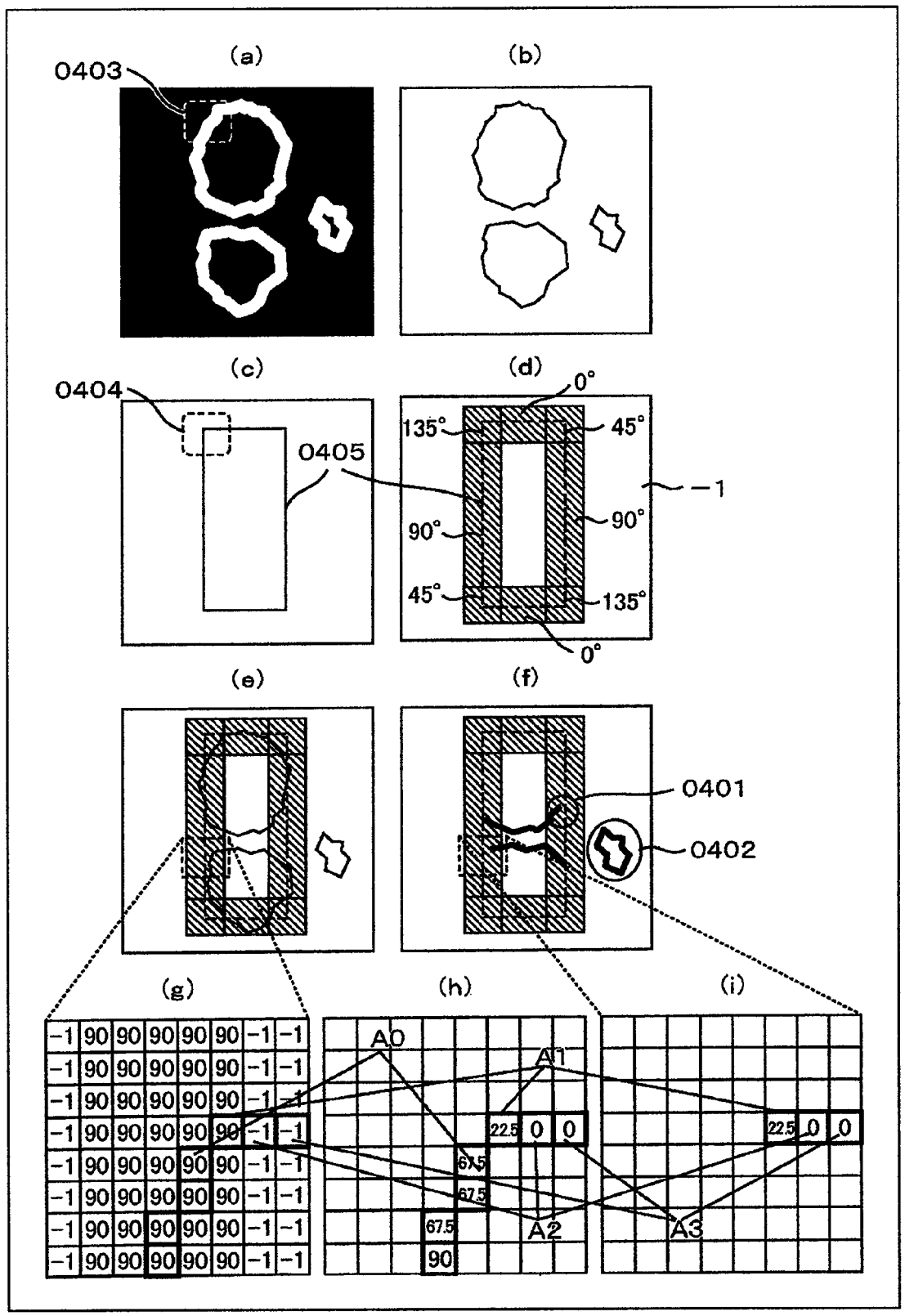
FIG. 4 is a diagram showing data to be used by pattern shape evaluation of the present invention.

FIG. 1 is a block diagram illustrating a basic principle of the present invention. FIG. 4 is a diagram showing data to be used in each block shown in FIG. 1.

Figure 5:
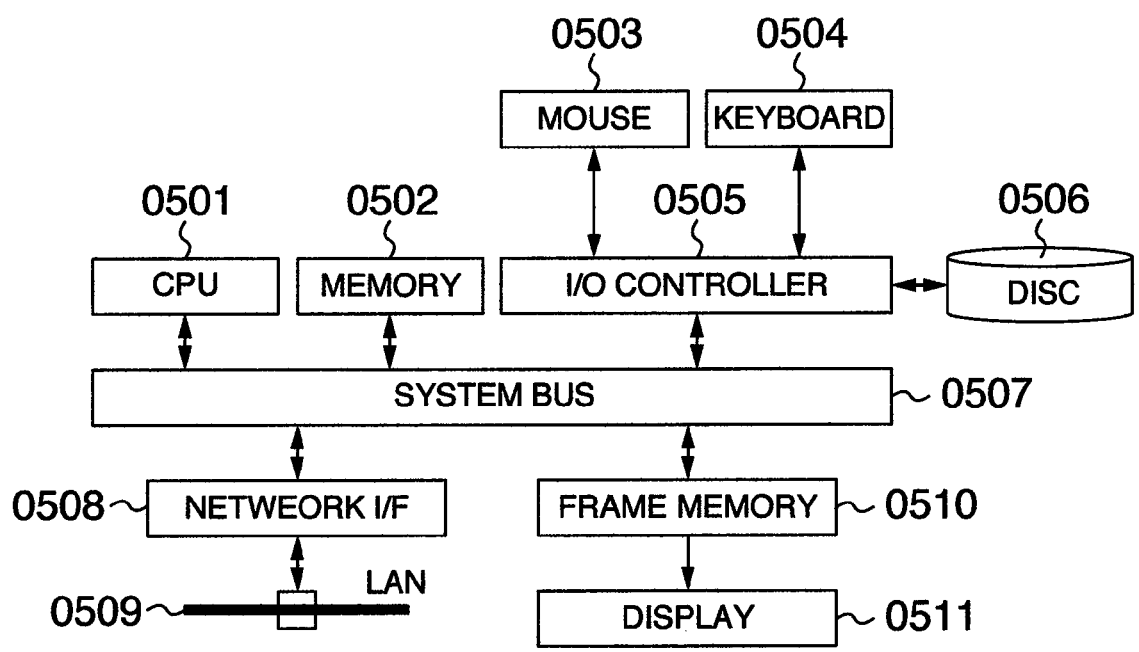
FIG. 5 is a diagram showing a computer system for executing pattern shape evaluation of the present invention in a software manner.
Figure 21:
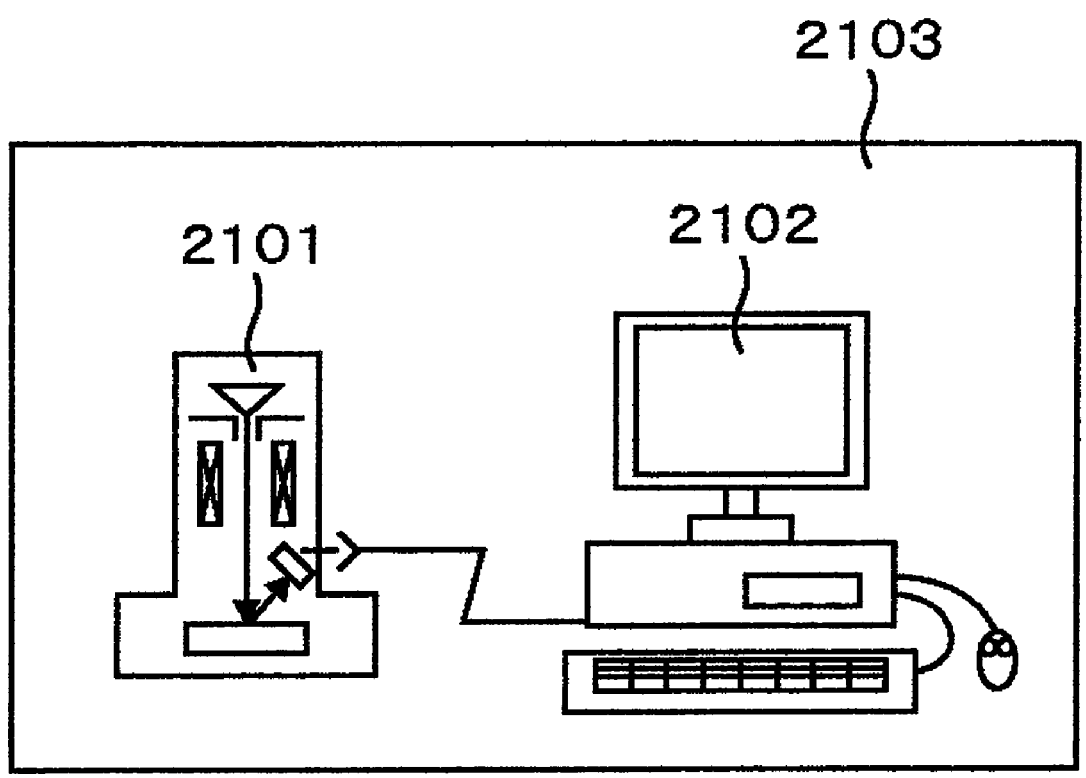
FIG. 21 is a diagram showing a semiconductor shape evaluation system equipped with a pattern shape evaluation method of the present invention.

The present invention is reduced in practice by a computer system such as shown in FIG. 5. Connected to a system bus 0507 of the computer system are a central processing unit (CPU) 0501, a memory 0502, an input/output (I/O) controller 0505, a network interface 0508 and a frame memory 0510. The I/O controller 0505 connects a disc 0506 storing design data of semiconductor and a photographed image of semiconductor, and receives from an external a signal such as parameters to be used for inspection of the present invention via a data input unit such as a mouse 0503 and a keyboard 0504. The frame memory 0510 stores therein data to be displayed on a display 0511, such as photographed images and design data of semiconductor and results of pattern shape evaluation of the present invention. The system bus 0507 is connected to a local area network (LAN) 0509 via the network interface 0508, and CPU 0501 executes a pattern shape evaluation process illustrated in FIG. 1 in a software way. As in the embodiment shown in FIG. 21, a computer system 2102 having a function equivalent to that of the above-described computer system is also mounted on a semiconductor inspection system mounting a semiconductor photographing device 2101 such as an optical microscope and a scanning electron microscope (SEM). The computer system 2102 of this semiconductor inspection system 2103 can also perform pattern shape evaluation of the present invention.

The details of each block shown in FIG. 1 will be now be described.

A contour extraction unit 0103 detects a contour of a pattern from image data 0101 obtained by photographing a circuit pattern of an electronic device manufactured on a silicon wafer such as shown in a portion (a) of FIG. 4 or a circuit pattern of an electronic device formed on a mask to be used for exposure of the pattern, and generates contour data 0107 such as shown in a portion (b) of FIG. 4. This contour extraction unit 0103 removes information unnecessary for pattern shape evaluation such as noises and background contained in the image data 0101 when photographing the pattern.

Figure 2:
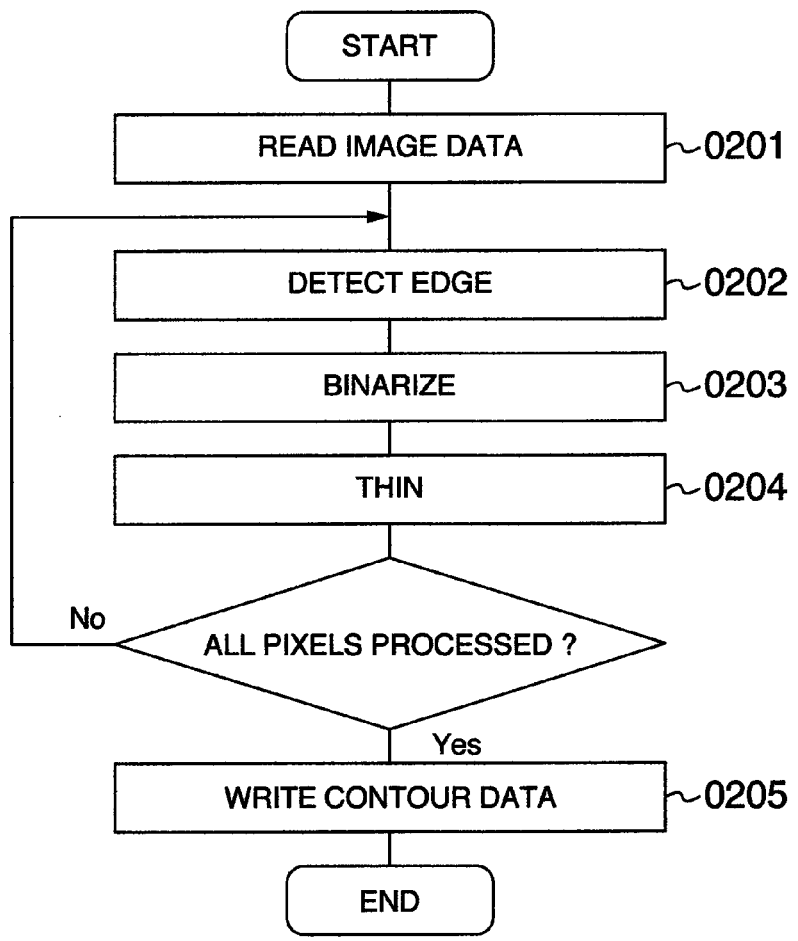
FIG. 2 is a flow chart illustrating a contour data generation sequence.

FIG. 2 is a flow chart illustrating a contour extraction sequence. First, image data the disc or memory is read at Step 0201. Next, an edge detection process is performed for the image data 0101 at Step 0202. Image data to be used for semiconductor inspection is generally gray information having a luminance signal of 8 bits per pixel, 16 bits per pixel or the like which signal has a slightly different luminance value distribution state (such as a luminance distribution having peak pattern positions and a luminance distribution having stepwise pattern positions) depending upon a semiconductor photographing device and a sample material quality. As disclosed in the image characteristic extraction paragraph in "Computer Image Processing" written by Hideyuki TAMURA, an edge can be detected by utilizing an edge detection operator suitable for a luminance value distribution state of a pattern area. Since edge data is generally gray information, contour data of a pattern is generated by subjecting the edge data to a binarizing process at Step 0203 by binary image processing disclosed in "Computer Image Processing" and to a line thinning process at Step 0204. These processes are executed for all pixels. The contour data generated finally is written in the memory or disc at Step 0205. In this embodiment, although description will be made on an example wherein a pattern defect is detected by using the contour data 0107 expressing a pattern position on the pixel unit basis, a pattern position may be expressed by a pixel not larger than by one pixel, by subjecting edge data to a subpixel position estimation process using a fitting function disclosed in detection techniques for patterns and figures in "Digital Image Processing" written by CG-ARTTS Association. In this case, as compared to processing contour data on the pixel unit basis, a defect position can be detected more precisely.

A direction distribution generation unit 0104 generates direction distribution data 0108 such as shown in a portion (d) of FIG. 4 from design data 0102 such as shown in a portion (c) of FIG. 4. The direction distribution data 0108 is data for judging an abnormal or defective pattern through comparison with the contour data 0107, and is characterized in that this data has values related to the following two items as its pixel values.

(1) Pattern Tolerance Area

All pixels of the direction distribution data 0108 have data for judging whether pattern deformation is in an allowable range (hereinafter called a tolerance area) or an unallowable range (hereinafter called an abnormal area), by using as a criterion a pattern position of the design data 0102.

(2) Pattern Direction

All pixels in the tolerance area have data for judging, from comparison with the data regarding a pattern direction contained in the contour data 0107, whether the contour data 0107 is normal or abnormal.

The direction distribution data shown in a portion (d) of FIG. 4 has a negative value "−1" as a pixel value corresponding to the pattern abnormal area, and a positive value "0°" to "135°" representative of the normal pattern direction at each pixel position. By comparing this direction distribution data 0108 with the contour data 0107 as shown in a portion (e) of FIG. 4, it is possible to judge as a defect a defect pattern 0401 in the tolerance area whose pattern direction value of the contour data 0107 existing in the tolerance area, e.g., such as shown in a portion (f) of FIG. 4 is considerably different from the direction value of the direction distribution data 0108, and a defect pattern 0402 of the contour data 0107 in the abnormal area/

Figure 3:
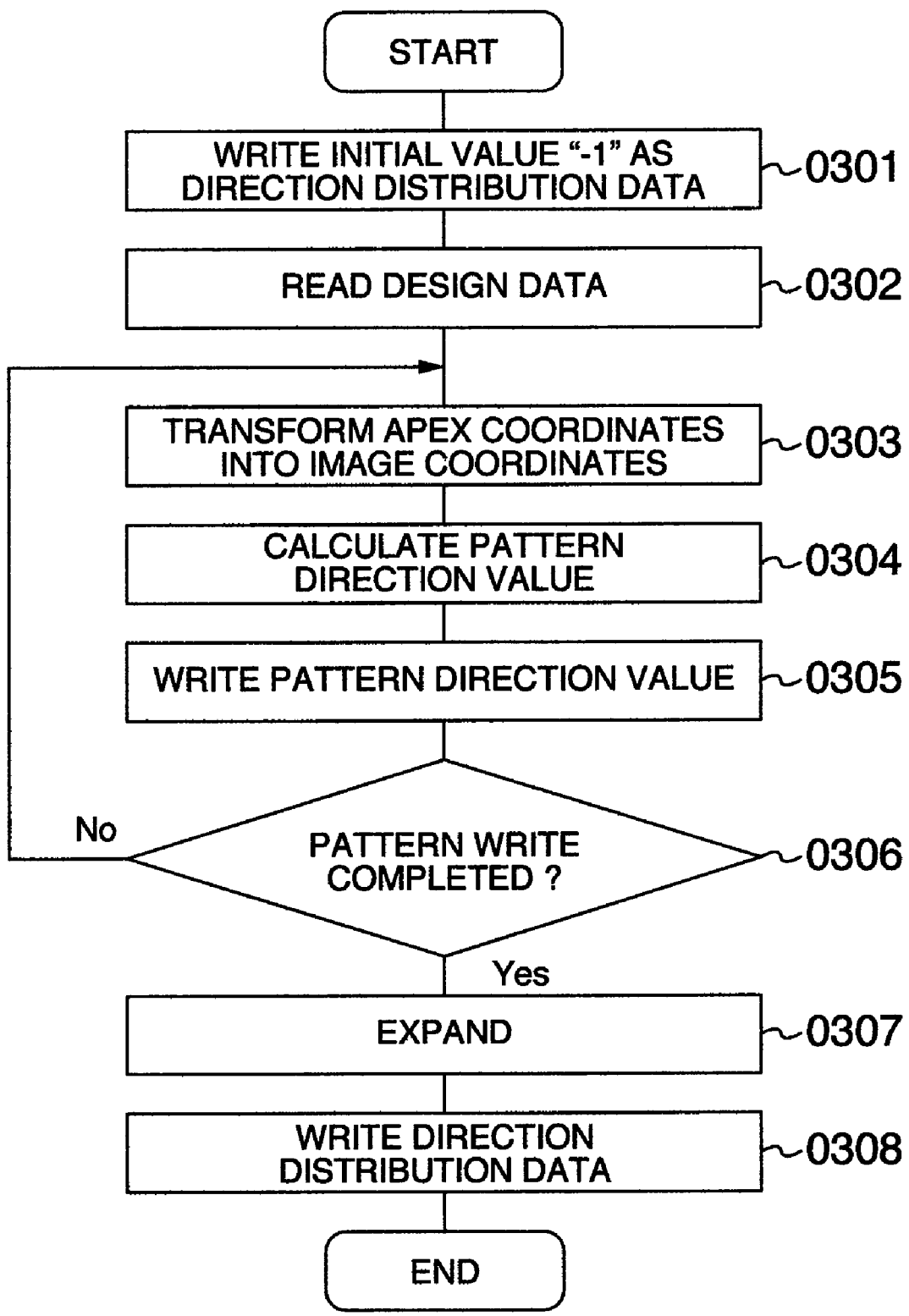
FIG. 3 is a flow chart illustrating a direction distribution data generation sequence.

FIG. 3 is a flow chart illustrating a process of generating direction distribution data 0108.

The direction distribution data 0108 can be generated, for example, by the sequence illustrated in the flow chart of FIG. 3. It is however to be noted that a criterion for judging a pattern tolerance and direction whether it is abnormal or normal is to be determined by know how of a semiconductor developer. The generation sequence for the direction distribution data 0108 to be described hereunder is not intended to limit a distribution state and its generation method for the direction distribution data 0108 representative of the pattern tolerance and direction.

First, an initial value "−1" representative of an abnormal area is written as the direction distribution data 0108 at Step 0301. The direction distribution data 0108 is data capable of expressing a pattern area contained in the image data 0101 at the same resolution as that of the contour data 0107. Next, design data (corresponding to the pattern contained in the image data 0101) is read from the disc or memory at Step 0302. The semiconductor design data 0102 is generally written with the number of apexes and the coordinates of each apex on a wafer, as information constituting the pattern. The apex coordinates are converted at Step 0303 into apex coordinates on the direction distribution data 0108, in accordance with a photographing magnification of the image data 0101, a pattern direction value for each pixel between apex coordinates is obtained at Step S0304 by a method to be describe later, and the pattern direction value is written in the direction distribution data 0108 as a one pixel width pattern at S0305. This pattern write is performed for all patterns contained in the image data 0101 at Step 0306.

Next, description will be made on a method of obtaining a pattern direction value from the design data 0102. A direction value of a straight line pattern between apexes can be obtained from apex coordinates constituting the start and end points of the straight line pattern. This will be described by using an example shown in FIG. 6.

Figure 6C:
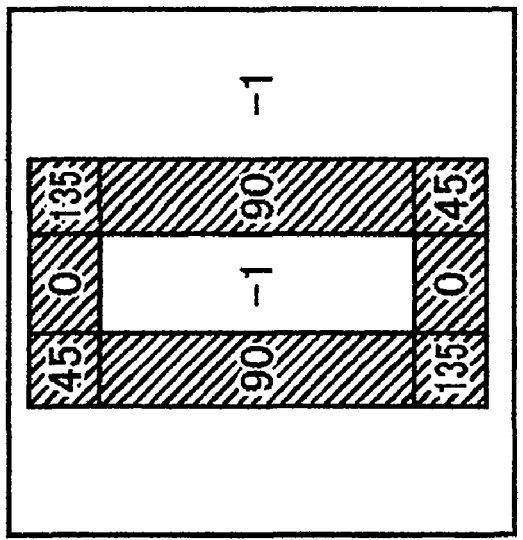
FIG. 6A to 6C are diagrams showing direction distribution data.
Figure 6B:
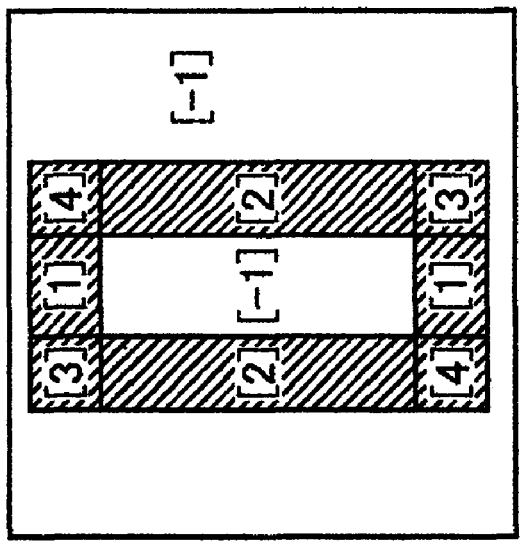
Figure 6A:
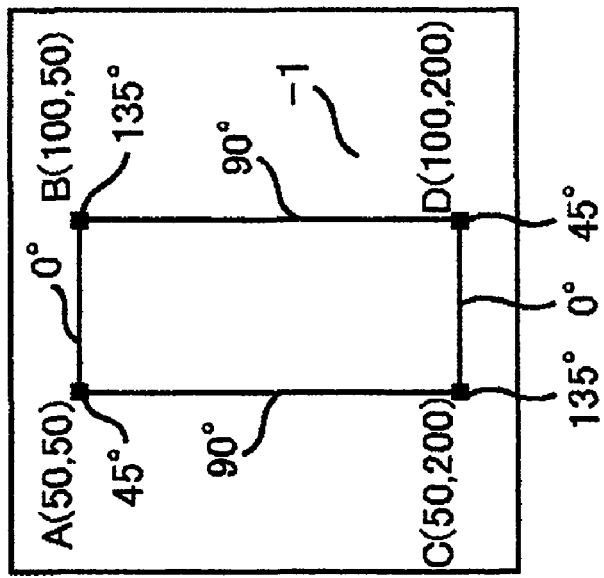

FIG. 6A is a diagram showing an image obtained by converting a rectangle pattern of design data constituted of apex coordinates A to D into image coordinates.

Straight lines between a point A (x=50, y=50) and a point B (x=100, y=50) and between a point C (x=50, y=200) and a point D (x=100, y=200) are straight lines along a 0° direction because the values of Y-coordinates of two points are equal, and straight lines between the points A and C and between the points B and D are straight lines along a 90° direction because the values of X-coordinates of two points are equal. A direction value of an apex position, and hence a pattern direction, is judged from the relation between two sets of apex coordinates interposing the first-mentioned apex. It is very difficult to reproduce a shape of an apex of design data, i.e., a right angle pattern, on a wafer, An apex area 0404 of design data shown in the portion (c) of FIG. 4 becomes an apex area 0403 of a pattern formed on a wafer corresponding to the apex area of design data having an oblique direction angle shown in the portion (a) of FIG. 4. Therefore, a pattern shape near an apex area is permitted to have displacement from the pattern shape of design data, more than other pattern shapes to some degree. Therefore, the area near an apex area of the pattern of the direction distribution data 0108 has preferably a direction value at which an oblique direction pattern is judged normal at the comparison process 0105 to be later described. For example, the apex A shown in FIG. 6A is judged as a pattern in a 45° direction from the relation between apex coordinates X and Y of the A, B and C points (X coordinate of point A=X coordinate of point C, Y coordinate of point A=Y coordinate of point B, X coordinate of point A<X coordinate of point B), and the apex D shown in FIG. 6A is judged as a pattern in a 135° direction from the relation between apex coordinates X and Y of the D, B and C points (X coordinate of point D=X coordinate of point B, Y coordinate of point D=Y coordinate of point C, X coordinate of point D<X coordinate of point C).

Next, an expansion process is performed for the direction distribution data 0108 at Step 0307, and a result of conversion of a direction identification value into a pattern direction value is written in the direction distribution data at Step 0308. The expansion process is general image processing of referring to several peripheral pixels of a processing object pixel, and replacing the value of the processing object pixel with the highest pixel value among the referred pixels, and is called also a maximum value filter process or a MAX filter process. Next, the direction value of the pattern is converted into the direction identification value which is in turn written in the direction distribution data 0108. For the use convenience of the expansion process, the direction value of the pattern obtained by the above-described method is once replaced with the direction identification value such as described below. For example, the direction identification value takes "1" for the pattern area in the 0° direction, "2" for the pattern area in the 90° direction, "3" for the pattern area in the 45° direction, "4" for the pattern area in the 135° direction, and "−1" for the area other than the pattern. By utilizing this direction identification value, the direction distribution data 0108 representative of an allowable range of a pattern shape having a width of several pixels can be generated from the direction distribution data 0108 of a pattern having a one pixel width, by a simple method. It is an important point to set the direction identification value of the apex area to a lager value than that of the straight line area.

The direction identification value of the pattern area is larger than the direction identification value "−1" of the area other than the pattern. Therefore, for example, if a reference pixel area is 3×3 pixels and one expansion process is performed for the whole plane of the direction distribution data 0108, the pattern area having a one-pixel width can be converted into a pattern having a three-pixel width area. By repeating this expansion process, it is possible to broaden the pixel width of a pattern. For example, if a pattern tolerance range corresponds to a five-pixel width in image coordinates, for the direction distribution data 0108 having a tolerance range of a 5×5 pixel width, direction distribution data 0108 having a tolerance range of 5×5 pixel width can be generated by the expansion process with reference pixels of 3×3 pixels and two repetitions. Further, the direction identification value of the apex area of a pattern is larger than that of the straight line area of the pattern, so that the apex area will not be reduced by the expansion process. With this expansion process, it becomes possible to generate the direction distribution data 0108 having the direction identification values of "−1", "1" to "4" shown in FIG. 6B. FIG. 6C shows the direction distribution data whose direction identification values are converted into the pattern direction values. An area of "−1" indicates an abnormal area, and the areas of 0°, 45°, 90° and 135° are data representing the tolerance range of the pattern.

Figure 9:
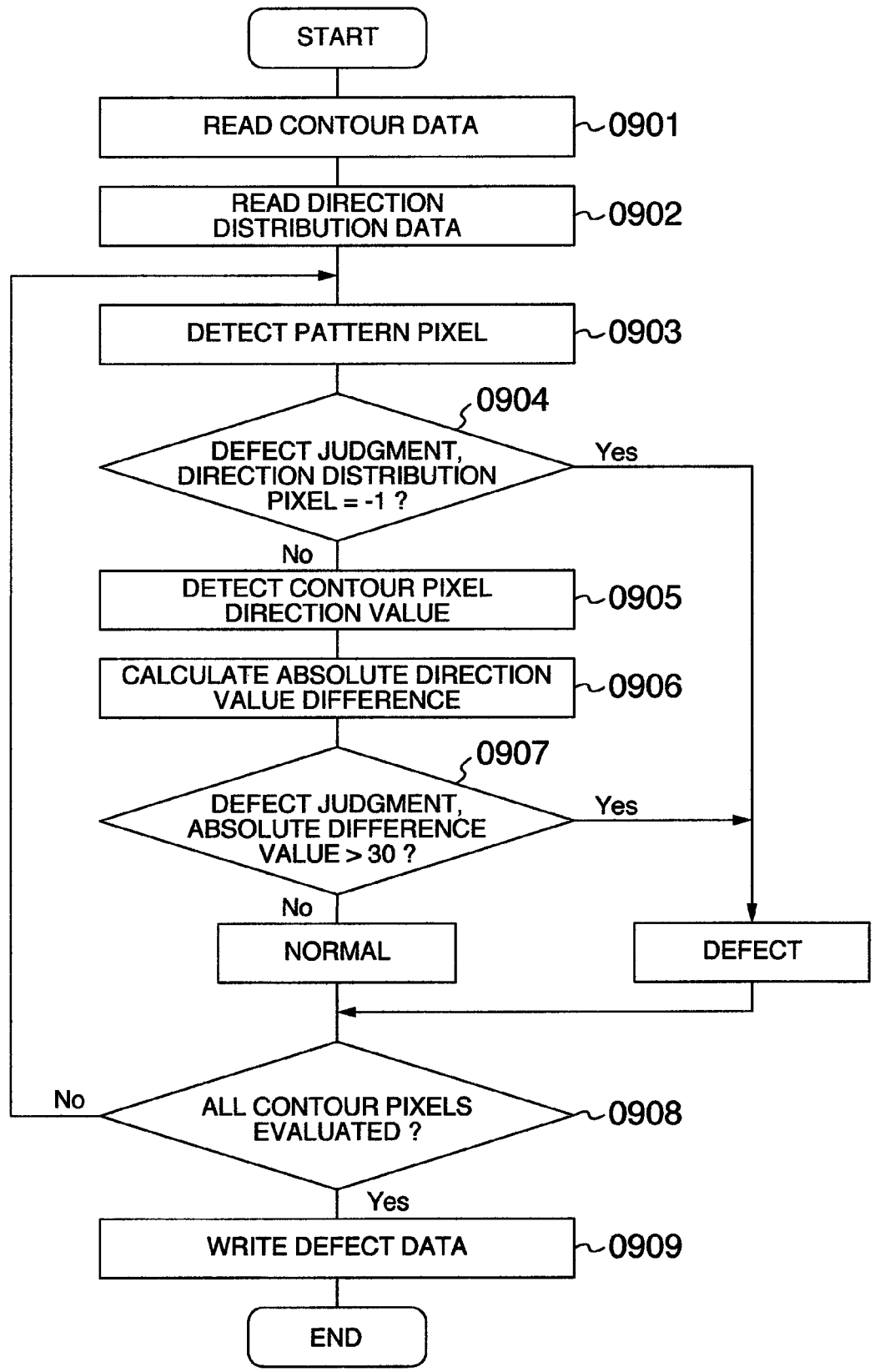
FIG. 9 is a flow chart illustrating an operation of a comparison unit.

In the comparison process 0105, a pattern position in the contour data 0107 is compared with the direction distribution data 0108 corresponding to the pattern position to detect defect data 0106 in the contour data 0107. FIG. 9 is a flow chart illustrating the comparison process 0105. First, the contour data 0107 and direction distribution data 0108 are read from the memory or disc at Steps 0901 and 0902. Next, a pattern position in the contour data 0107 is detected at Step 0903, and the direction distribution data 0108 corresponding to the pattern position is referred to.

Next, description will be made on a pattern defect detection sequence by using as an example, comparison between the direction distribution data such as shown in a portion (g) of FIG. 4 and the contour data such as shown in a portion (h) of FIG. 4. Pixels in a thick black frame in the direction distribution data shown in the portion (g) of FIG. 4 corresponds to pattern positions of the contour data shown in the portion (h) of FIG. 4.

At pattern positions A2 and A3, since the direction value of the direction distribution data corresponding to the pattern positions is "−1", it is judged at Step 0904 that the pattern is in the abnormal area, and is a defect. At pattern positions A0 and A1, since the direction value of the direction distribution data is positive, the pattern direction value of each contour pixel is detected at Step 0905. The pattern direction value can be detected by using, for example, templates shown in FIG. 22. Each template is constituted of a matrix of 3×3 pixels each having a weight coefficient. Coefficient layouts indicate pattern directions of 0°, 22.5°, 45°, 67.5°, 90°, 110.5°, 135°, and 157.5°. These fourteen matrices are convolved into 3×3 pixel areas around each pattern position of the contour data 0107, and the direction value of the template having a highest output value is used as the direction value of the pattern position. For example, FIG. 8 shows the results of convolution of fourteen matrices shown in FIG. 22 upon each of three types (0°, 90° and 45° directions, contour pixel=1, non-contour pixel=0) of 3×3 pixel areas around each contour pixel such as shown in FIG. 7. It can be understood that the largest values are given for the convolution results by No. 1 (direction value 0°) relative to the pattern position in the 0° direction, for the convolution results by No. 8 (direction value 90°) relative to the pattern position in the 90° direction, and for the convolution results by No. 4 (direction value 45°) relative to the pattern position in the 45° direction. By the template process of this kind, the direction value of the pattern position can be detected. If the pattern position direction cannot be judged precisely for a small area such as 3×3 pixels, because of influence of noises contained in the direction distribution data 0108, the matrix size shown in FIGS. 6A to 6C may be enlarged using similar coefficient layouts, and the above-described template process is executed so that a precise pattern direction value can be detected.

By applying a broken line approximation process for a line figure in the binary image processing described in "Computer Image Processing" written by Hideyuki TAMURA, to the contour data 0107, an approximate straight line of a pattern can be formed from information on a plurality of pattern positions consecutive in the contour data 0107. By replacing the straight line position with pixel positions of the pattern, it is possible to suppress a local shape variation of a pattern to be caused by influence of noises or the like contained in the image data 0101, and to use the direction value of the straight line itself as the direction value of the pattern position. This calculation of the direction value of the contour data 0107 may be performed during a sequence by the contour extraction unit 0103.

Next, an absolute difference value is calculated at Step 0906 between the direction value of the pattern of the contour data 0107 and the direction value of the direction distribution data 0108. For example, since the pattern position A0 shown in the portion (h) of FIG. 4 has a pattern direction value of 67.5° and a direction distribution data direction value of 90°, an absolute direction difference value is ABS(67.5−90)=22.5. Since the pattern position A1 has a pattern direction value of 22.5° and a direction distribution data direction value of 90°, an absolute direction difference value is ABS(22.5−90)=67.5. This absolute direction difference value is compared with a threshold value which is used for judging whether a pattern is a detect or not. For example, if a pattern deformation allowable range is 0° to 30° and a threshold value is 30, then a pattern having an absolute direction difference value larger than 30 is judged as a defect at Step 0907. Since a contour line pixel A1 has an absolute direction difference value of 22.5, this pixel is judged normal, whereas since a contour pixel A2 has an absolute direction difference value of 67.5, this pixel is judged as a defect. Lastly, data representative of a pattern judged as a defect is written in the memory or disc. The threshold value to be used for defect judgment may be set as an inspection parameter by a user via the mouse or keyboard.

This comparison process is executed for all contour pixels in the contour data 0107 so that pattern defects contained in the contour data such as shown in the portions (f) and (i) of FIG. 4 can be detected.

Figure 10:
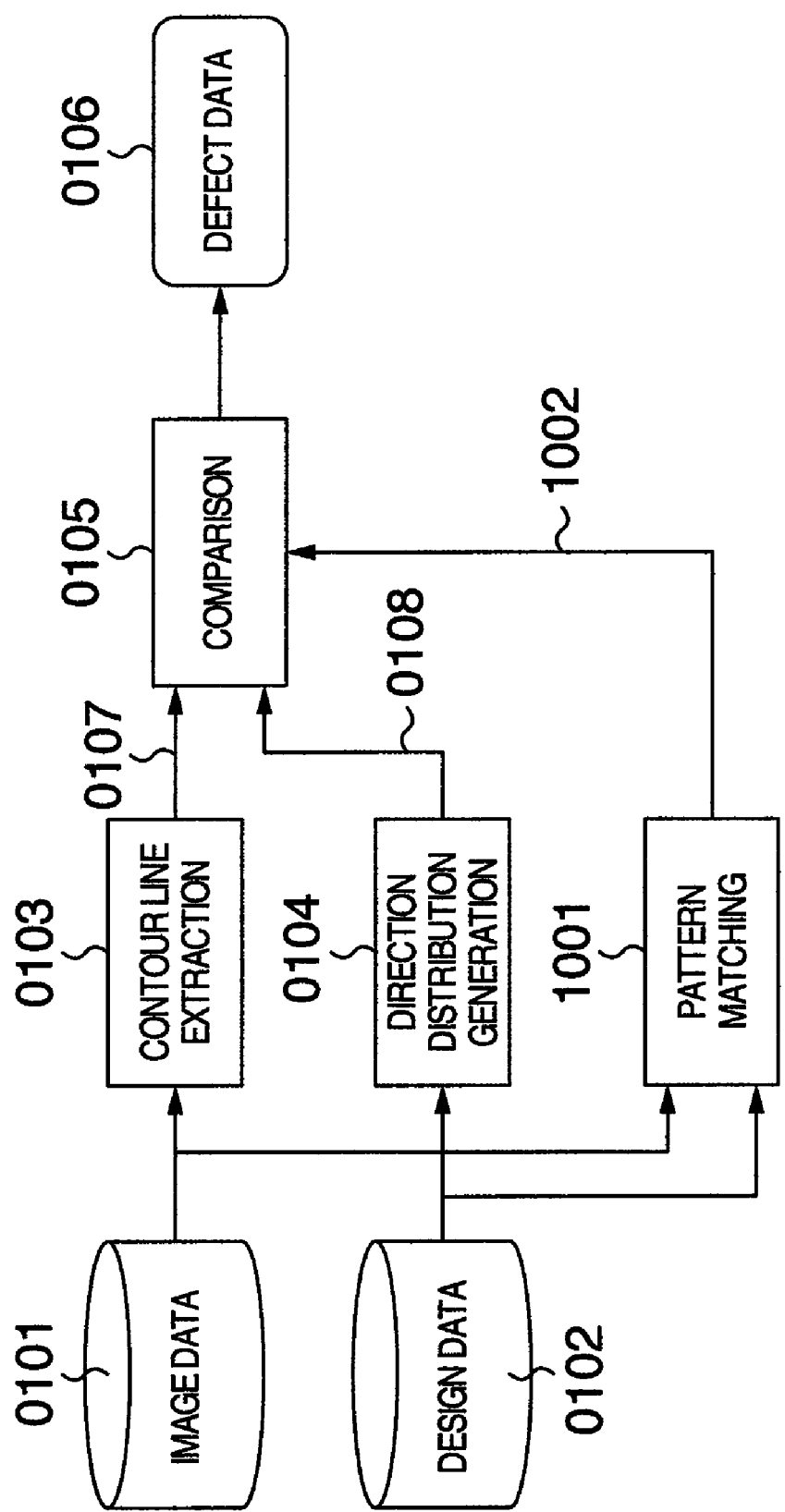
FIG. 10 is a block diagram illustrating a pattern shape evaluation method utilizing pattern matching.

In the present invention, a pattern shape evaluation is performed by comparing the pattern of the contour data 0107 such as shown in the portion (e) of FIG. 4 with the direction distribution data 0108 corresponding to the pattern position. It is therefore preferable to generate the direction distribution data 0108 in such a manner that the position of the pattern to be compared and the position of the direction distribution data indicate the same position on a wafer. However, if the positional relation between the contour data 0107 and direction distribution data 0108 is unknown, as shown in FIG. 10 a position shift amount of the image data 0101 relative to the design data 0102 or a position shift amount (hereinafter called a shift amount 1002) of the design data 0102 relative of the image data 0101 can be calculated through pattern matching 1001 between the design data 0102 and image data 0101, and pattern shape evaluation becomes possible by the comparison process 0105 considering the shift amount 1002. However, with a general pattern matching method such as a normalized correlation method and a residual minimum method, a precise shift amount 1002 may not be detected if the pattern shape of the design data 0102 is different from a pattern shape contained in the image data 0101. Even if pattern shapes are different, a precise shift amount can be detected by an approach disclosed in JP-A-HEI-6-96214. According to this approach, a shift amount is detected by a normalized correlation method after the shape of design data is adjusted to be aligned with the pattern shape on a wafer.

Figure 13:
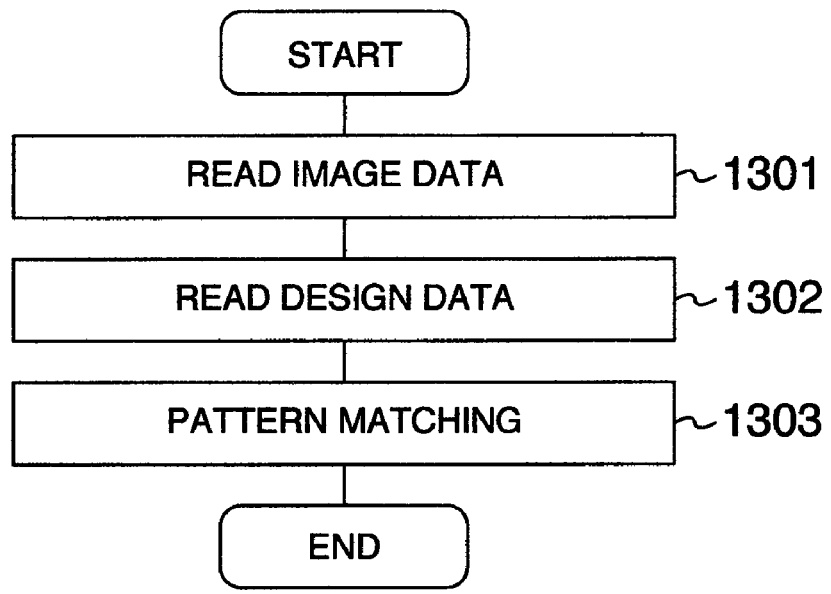
FIG. 13 is a flow chart illustrating a pattern matching sequence.

FIG. 13 is a flow chart illustrating the pattern matching 1001. First, the design data 0102 and image data 0101 are read from the disc or memory at Steps 1301 and 1302, and pattern matching adaptive to the different pattern shapes is executed to detect a shift amount 1002 at Step 1303. If a shift amount is detected by pattern matching, a direction value of the direction distribution data is obtained from coordinate values obtained by adding the shift amount 1002 to the coordinate values of the pattern position of the contour data 0107 to thereby execute the comparison process. In this manner, the pattern shape evaluation can be made even if the positional relation is unknown between the image data 0101 and design data 0102.

Figure 11:
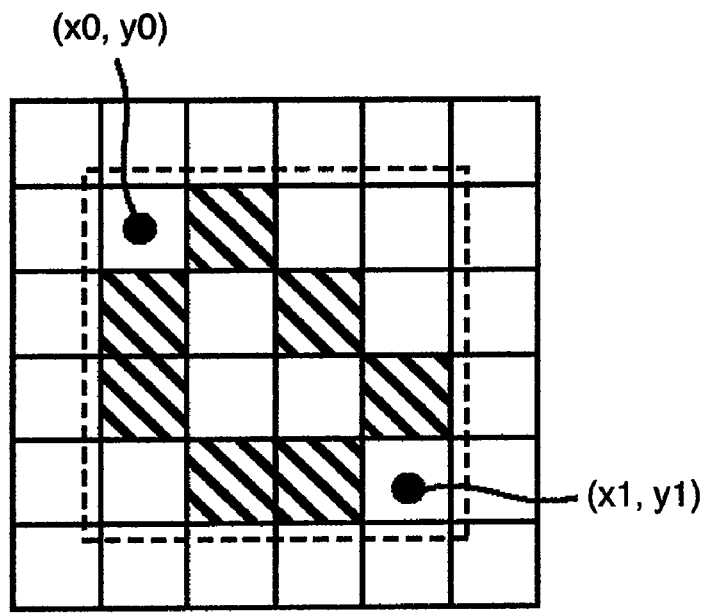
FIG. 11 is a diagram showing defect data.

In the above-described comparison process, although a defect position in the contour data 0107 is detected on the pixel unit basis, defects consecutive as a pattern may be detected as coordinate data (x0, y0)→(x1, y1) representative of a rectangular area containing a set of defect pixels as shown in FIG. 11, by performing a labeling process for the consecutive defects disclosed in the binary image processing of "Computer Image Processing" by Hideyuki TAMURA in combination with a process of searching a rectangular area containing the same label.

Figure 12:
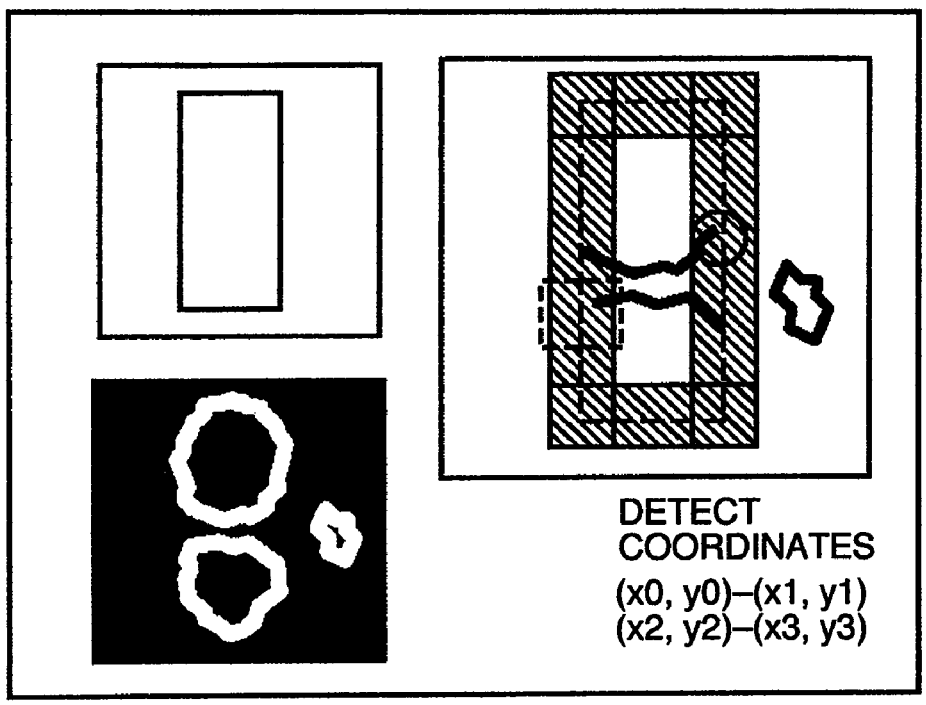
FIG. 12 is a diagram showing a screen displaying pattern shape evaluation results of the present invention.

The design data 0102 and image data 0101 used for inspection and the defect data 0106 may be written in the frame memory in the format such as shown in FIG. 12 to display these data on a display and provide a user with the inspection results.

In the above description, a direction value of a normal pattern is input to the direction distribution data 0108, and a pattern whose absolute direction difference value is outside a certain range, this pattern is detected as the defect data 0106. Instead, for example, an allowable pattern direction range may be input to the direction distribution data 0108, and the comparison process 0105 judges whether the direction value of the contour data 0107 is inside or outside the allowable pattern direction range to thereby detect the defect data 0106. In this case, the direction value for detecting a defect and an abnormal state can be adjusted depending upon a pattern position.

As described above, according to the embodiment, erroneous judgment of defects which have been a problem of a conventional method can be reduced by comparing the contour data extracted from the image data with the direction distribution data indicating a pattern direction and a tolerance range using the design data as a reference. Further, since the process sequence is simple, detecting a defect position of a pattern at high speed can be realized.

(2) Second Embodiment

This embodiment describes a method of inspecting an abnormal state and a defect of a pattern by utilizing direction distribution data 0108 defined by a user. This invention is also reduced in practice by the computer system shown in FIG. 5. Processes other than those of the direction distribution generation unit 0104 are similar to those of the first embodiment, and the description thereof is omitted.

Figure 14:
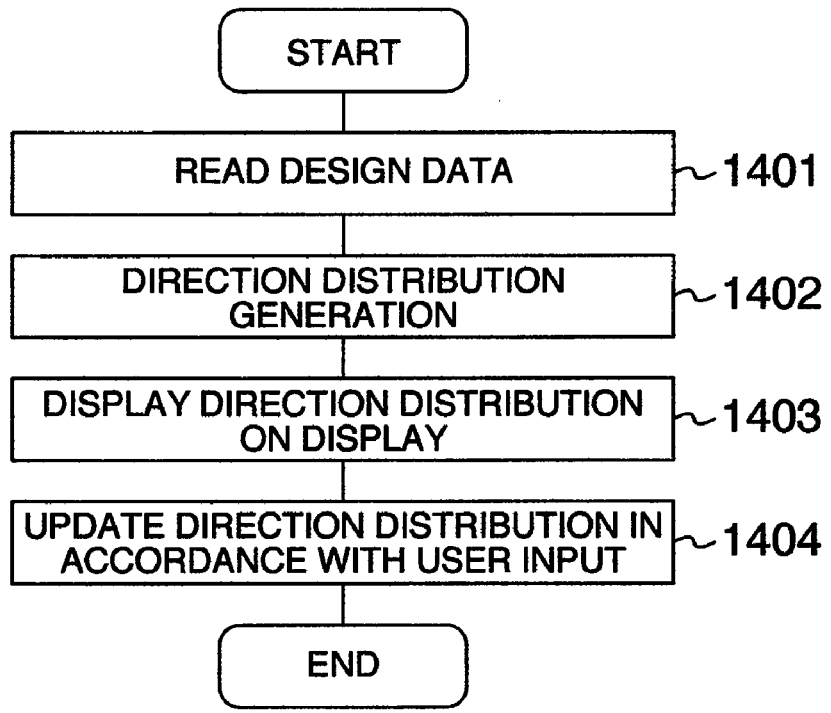
FIG. 14 is a flow chart illustrating a direction distribution generation sequence according to a second embodiment.

FIG. 14 is a flow chart illustrating the process to be executed by the direction distribution generation unit 0104 of the present invention. The design data 0102 is first read at Step 1401, direction distribution data 0108 is generated by a simplified method described in the first embodiment at Step 1402, and thereafter the direction distribution data 0108 is written in the frame memory and displayed on the display at Step 1403. Next, a user is urged to input a correction value of the direction distribution data 0108 via the keyboard or mouse. In accordance with the correction value designated by the user, the direction distribution generation unit 0104 updates the direction distribution data 0108 at Step 1404, and thereafter the defect detection is performed in the manner described in the first embodiment. User definition of the direction distribution data 0108 can thus be performed, and it is possible to detect the abnormal state and defect of a pattern intended by the user.

(3) Third Embodiment

This embodiment shows a method of inspecting an abnormal state and a defect of a pattern by utilizing parameters designated by a user for generating direction distribution data 0108 and efficiently generating the direction distribution data 0108. This invention is also reduced in practice by the computer system shown in FIG. 5. Processes other than those of the direction distribution generation unit 0104 are similar to those of the first embodiment, and the description thereof is omitted.

FIG. 16 is a flow chart illustrating a generation sequence for direction distribution data.

Figure 15B:
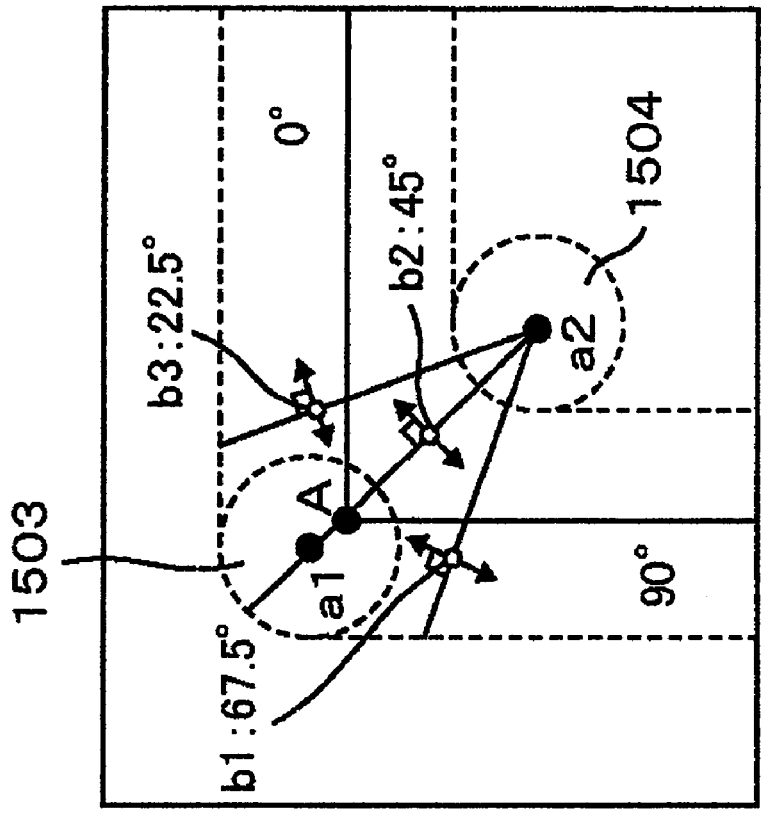
FIGS. 15A and 15B are diagrams illustrating a direction distribution generation sequence according to a third embodiment.
Figure 15A:
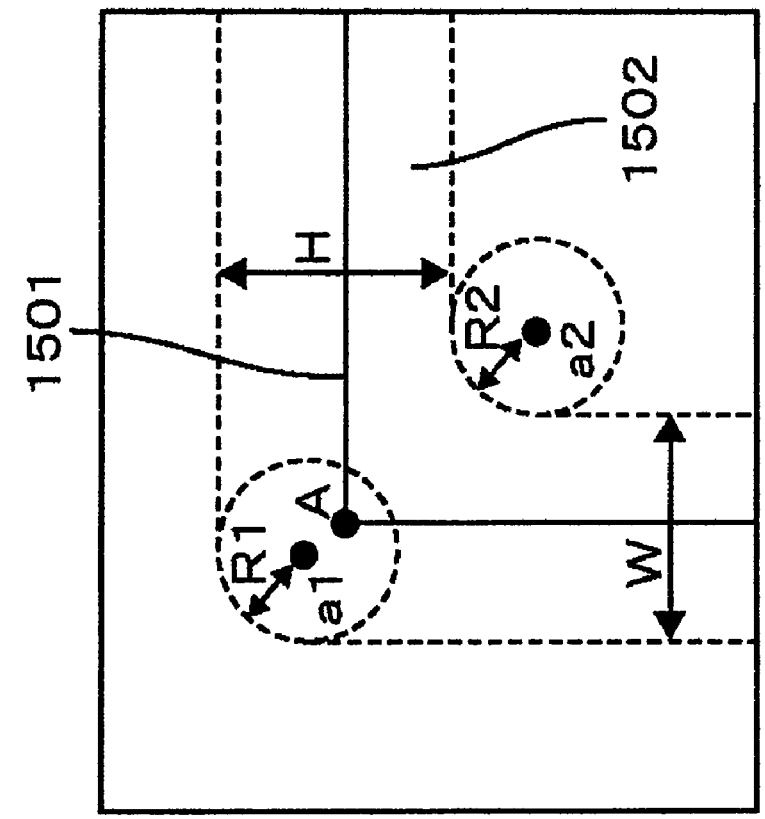

First, a parameter input screen for generating the direction distribution data 0108 is displayed on the display at Step 1601. As shown in FIG. 15A, the display also displays data allowing a user to judge the relation among respective parameters, design data 1501 and a tolerance area 1502. Examples of a parameter to be designated by a user are shown below.

(1) H: a parameter for setting a tolerance range of a straight line area in the 0° direction.

(2) W: a parameter for setting a tolerance range of a straight line area in the 90° direction.

(3) R1, a1(x, y): a parameter for generating a tolerance range outside a pattern corner area.

(4) R2, a2(x, y): a parameter for generating a tolerance range inside a pattern corner area.

Next, the design data 0102 corresponding to the image data 0101 to be inspected is read at Step 1602, and the direction distribution data 0108 is generated by using the parameters at Step 1603.

The direction distribution generation unit 0104 writes a direction value 90° in the W range of the direction distribution data 0108, for the pattern straight line area in the 0° direction of the input design data 0102, by using the pattern position of the design data as a reference, and writes a direction value 0° in the H range of the direction distribution data 0108, for the pattern straight line area in the 90° direction, by using the pattern position of the design data as a reference.

A tolerance range of the pattern apex area is determined by utilizing two circle patterns constituting the inner and outer frames of the direction distribution data, the shape of the pattern corner area constituting part of the circle pattern, as shown in FIG. 15A. a1(x, y) and a2(x, y) are parameters indicate relative positions between the pattern apex positions and the center positions of the circle patterns, and R1 and R2 are parameters indicate the radiuses of the circle patterns. A direction value is written in the tolerance range constituted of the tolerance range of the two circle patterns of the pattern apex areas and pattern straight line areas. More specifically, as shown in FIG. 15B, straight lines are drawn on the tolerance range from the center coordinates of the pattern inner frame circle pattern 1504 positioned inside the pattern, and normal directions of the straight lines are used as the pattern direction values. For example, since a position b1 has coordinates on the straight line in the 157.5° direction in the circular coordinates, a direction value is 67.5°, since a position b2 has coordinates on the straight line in the 135° direction in the circular coordinates, a direction value is 45°, and since a position b3 has coordinates on the straight line in the 112.5° direction in the circular coordinates, a direction value is 22.5°. These parameters are designated by using the mouth or keyboard. After the direction distribution data 0108 is generated, defect detection is performed in the manner described in the first embodiment.

As described above, according to the present invention, a user is urged to input a very small number of parameters regarding generation of the direction distribution data 0108, and the direction distribution data intended by the user can be generated efficiently. An abnormal state and a defect of pattern can therefore be inspected.

(4) Fourth Embodiment

In this embodiment, description will be made on a pattern shape evaluation method of identifying a defect type by using the defect data 0106 detected by the pattern shape evaluation described in the first embodiment.

Figure 17:
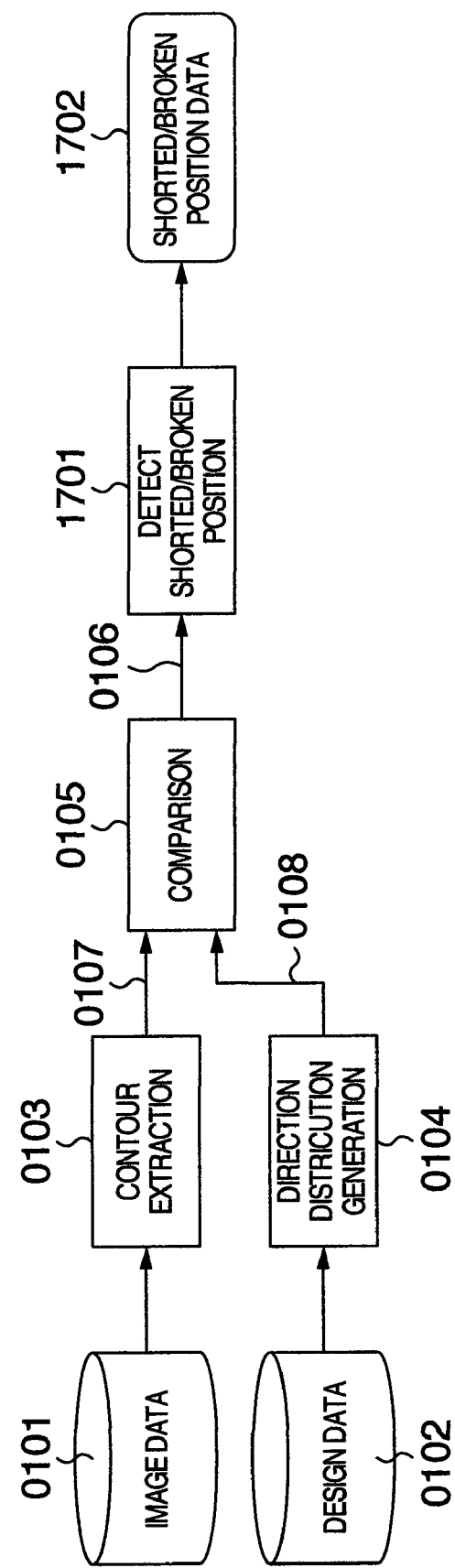
FIG. 17 is a block diagram illustrating a pattern shape evaluation sequence according to a fourth embodiment of the present invention.
Figure 18A:
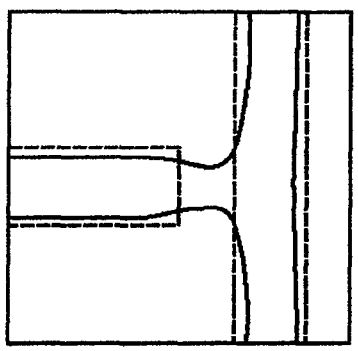
FIGS. 18A to 18F are diagrams illustrating the pattern shape evaluation according to the fourth embodiment of the present invention.
Figure 18B:
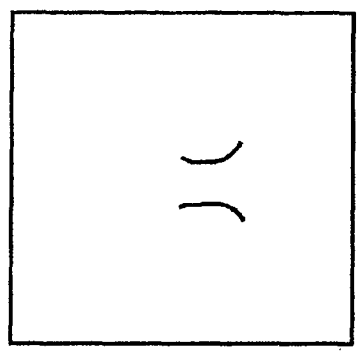
Figure 18C:
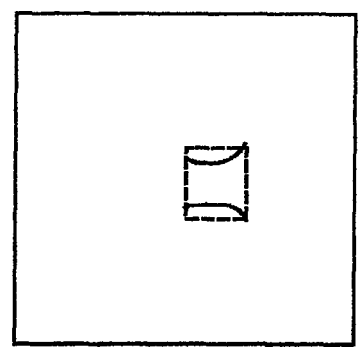
Figure 18D:
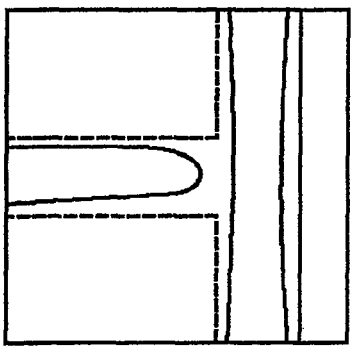
Figure 18E:
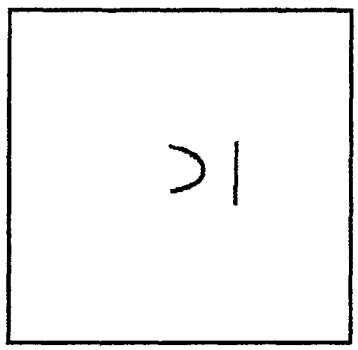
Figure 18F:
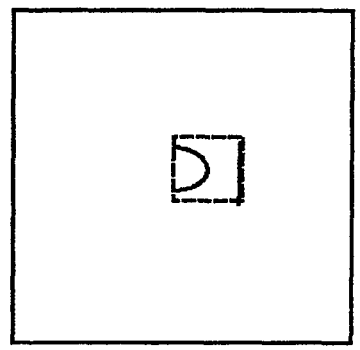

FIG. 17 is a block diagram of the present invention. The sequence up to generating the defect data 0106 is similar to that described in the first embodiment, and the description thereof is omitted. FIGS. 18A and 18B are images showing a design data pattern (broken line) and a contour data pattern (solid line) superposed each other. FIG. 18A shows a shorted contour data pattern, and FIG. 18B shows a broken contour data pattern. As the comparison process with the direction distribution data described in the first embodiment is performed for the two contour patterns, a defect pattern shown in FIG. 18C can be detected for the pattern shown in FIG. 18A, and a defect pattern shown in FIG. 18D can be detected for the pattern shown in FIG. 18B. Since these defect patterns are made of dot train coordinate data, a pattern shorted area and a pattern broken area are detected by using the dot train coordinate data. A defect existing inside the design data pattern has a high possibility that the defect is a shorted pattern, whereas a defect existing outside the design data pattern has a high possibility that the defect is a broken pattern. Further, as shown in FIGS. 18C and 18D, the pattern broken area and shorted area have each commonly opposing defect areas. The pattern shorted area and broken area are detected by using these characteristics.

Figure 19:
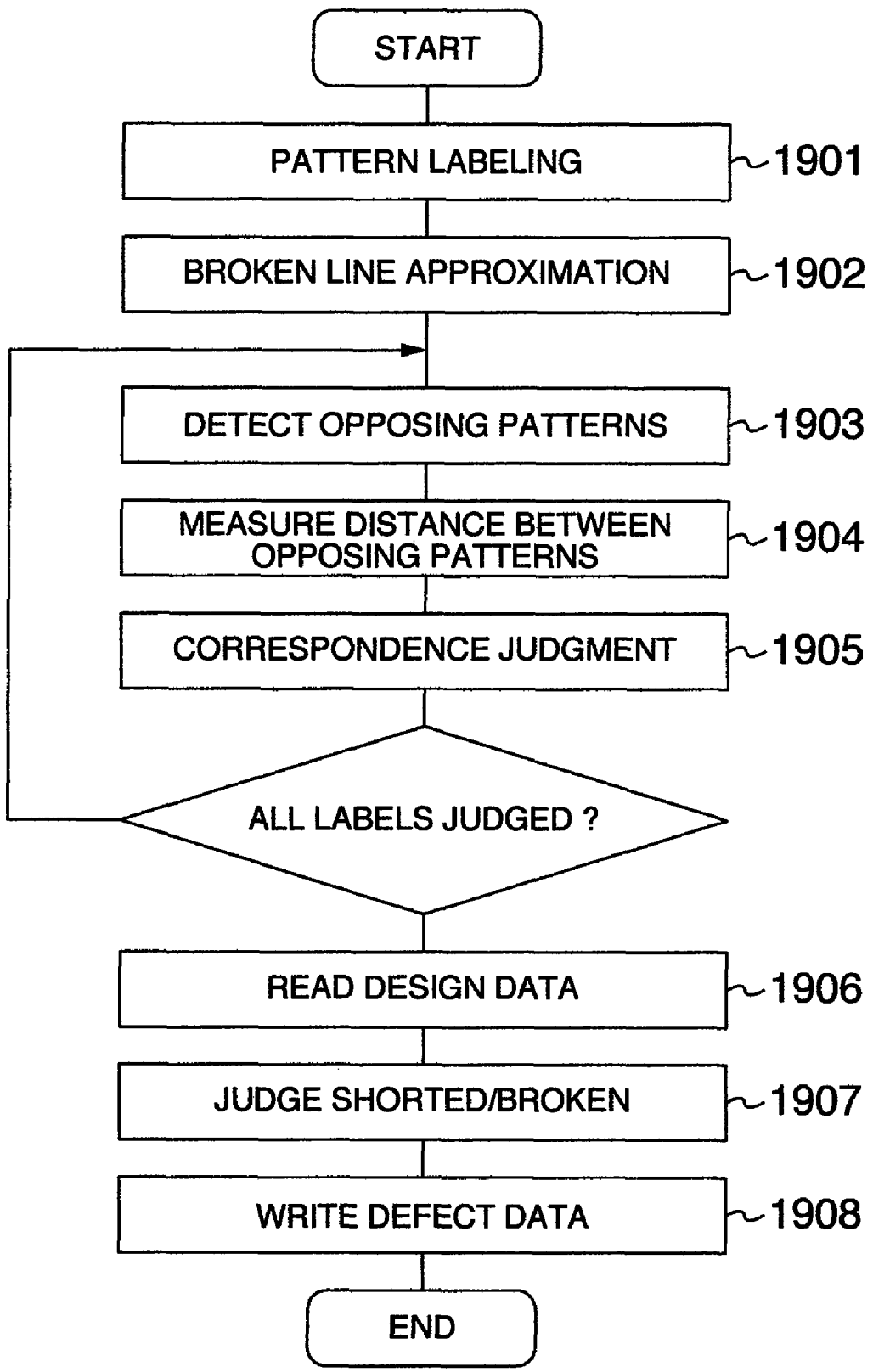
FIG. 19 is a flow chart illustrating a defect judgment sequence according to the fourth embodiment of the present invention.

A specific embodiment will be described with reference to the flow chart shown in FIG. 19. First, in order to discriminate consecutive defect coordinates from the dot train coordinate data of a defect such as shown in FIG. 20A obtained by the comparison process 0105, the labeling process publicized as the binary image processing techniques in "Computer Image Processing" by Hideyuki TAMURA is executed at Step 1901, and the broken line approximation process disclosed as the binary image processing techniques in "Computer Image Processing" by Hideyuki TAMURA is executed at Step 1902 to convert the defect pixel dot train into line segment data such as shown in FIG. 20B. Next, a line segment having a different label existing in a vertical direction to a direction of each line segment or in a range of a vertical direction ±L° is searched at Step 1903, and if it is judged at Step 1904 that a line segment direction difference is in an M range and a distance between lines is in an N range, then this line segment section is judged as a broken or shorted pattern area, such as shown in FIG. 20C, at Step 1905. This judgment process is performed for all labels. Next, a design data pattern corresponding to this area is read at Step 1906, the shorted area or broken area is judged at Step 1907 through judgment of whether the area is inside or outside the pattern constituted of apex coordinates of the design data. Lastly, coordinate information on a rectangle containing the shorted area or broken area and shorted/broken area judgment information are written as defect data in the memory or disc at Step 1908. Parameters such as L, M and N used for judgment can be designated by a user via the mouth or keyboard.

As described above, according to the present invention, a broken area and a shorted area of a pattern can be detected by using the coordinate data of a defect pattern expressed by dot train and by using the design data, and a user can be supplied with information arranged as defect data.

(5) Fifth Embodiment

Detection of Corrupt Pattern

Figure 39:
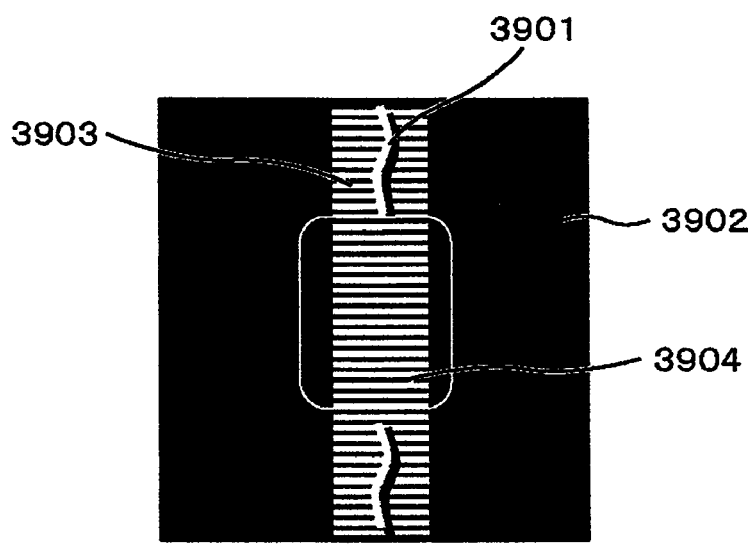
FIG. 39 is a diagram illustrating a corrupt pattern detection method.

This embodiment shows a method of detecting an area where a pattern which should exist does not formed (hereinafter called a pattern corrupt area), through comparison between direction distribution data and contour data. FIG. 39 is a diagram showing a tolerance area 3903 and an abnormal area 3902 of direction distribution data of a corrupt pattern area and contour data 3901, superposed each other. Since a contour does not exist in the pattern corrupt area, the pattern corrupt area can be detected by detecting a discontinuous section 3904 of the contour data on the direction distribution data. Description will be made on two methods of detecting the discontinuous section 3904 of the contour data.

(1) Corrupt Pattern Detection Method A

Figure 27:
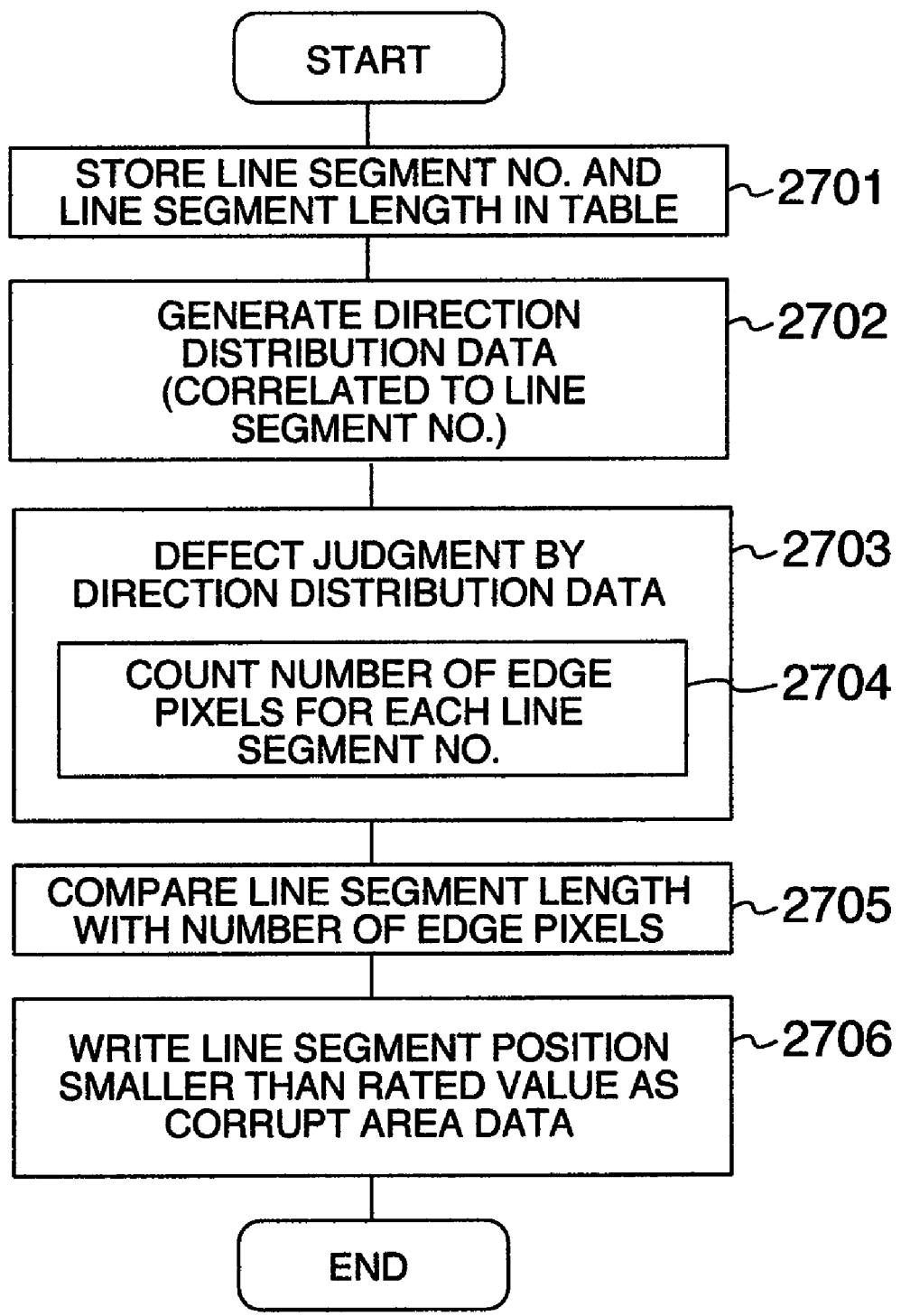
FIG. 27 is a flow chart illustrating the first detection method for a corrupt pattern.

This corrupt pattern area detection method will be described with reference to FIGS. 24A to 24D. FIG. 24A shows design data, FIG. 24B shows direction distribution data generated from the design data shown in FIG. 24B, and FIG. 24C shows contour data. The contour data has a discontinuous section 2303 of the contour to be detected. FIG. 27 is a flow chart illustrating the operation to be executed by the corrupt pattern detection method A. First, a length of each line segment (a line segment length in the pixel unit obtained from the photographing conditions such as an image photographing magnification factor) constituting the pattern of design data is obtained from the design data, together with its serial number at Step 2701. For example, the pattern of the design data shown in FIG. 24A is constituted of four line segments shown in FIG. 24A-1 to 24A-4. Line segment serial Nos. (1) to (4) are assigned to the line segments, and line segment lengths L1 to L4 are obtained. The line segment serial Nos. and line segment lengths are stored in the memory 0502 or disc 0506 in the table format such as shown in FIG. 23. Next, data is generated at Step 2702, with the tolerance area of the direction distribution data being correlated to the segment serial number. For example, the line segment serial number (1) is correlated to a tolerance area (1) of the direction distribution data. Similarly, the line segment serial number (2) is correlated to a tolerance area (2), the line segment serial number (3) is correlated to a tolerance area (3), and the line segment serial number (4) is correlated to a tolerance area (4). Correlation is performed by searching a line segment having the design data most nearest to the pixels of the tolerance area. Data correlated to the line segment serial number may be stored as special layer information of the direction distribution data. Next, the defect judgment is performed at Step 2703 by using the direction distribution data in the manner similar to that of the above-described embodiments. If contour data exists in the normal area during the defect judgment, the number of edge pixels of the line segment serial number corresponding to the contour pixel position is counted up, and stored in the table such as shown in FIG. 23 at Step 2704. After defect judgment of contour data, a line segment length at each line segment serial number is compared with the edge pixel number by using the table information shown in FIG. 23. If the edge pixel number is small as compared to the line segment length, position information 2304 of the line segment or line segment coordinates are written in the memory 0502 or disc 0506 as corrupt area data. Since a pattern shape may be distorted, expanded or contracted, a rated value such as the number of pixels several per cent or smaller relative to the line segment length may be set to suppress erroneous detection of a corrupt pattern area.

(1) Corrupt Pattern Detection Method B

Figure 25A:
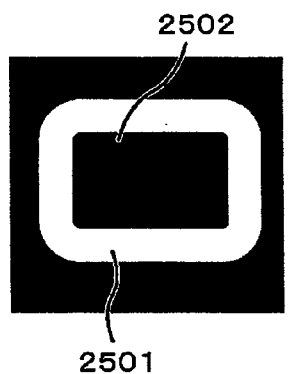
Figure 26A:
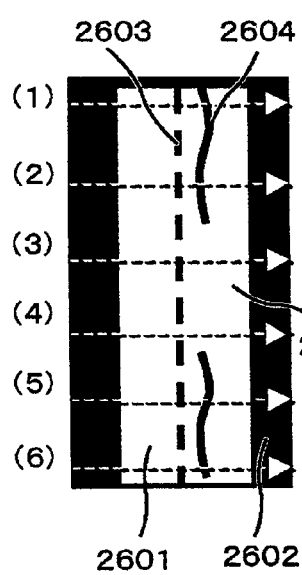
Figure 26C:
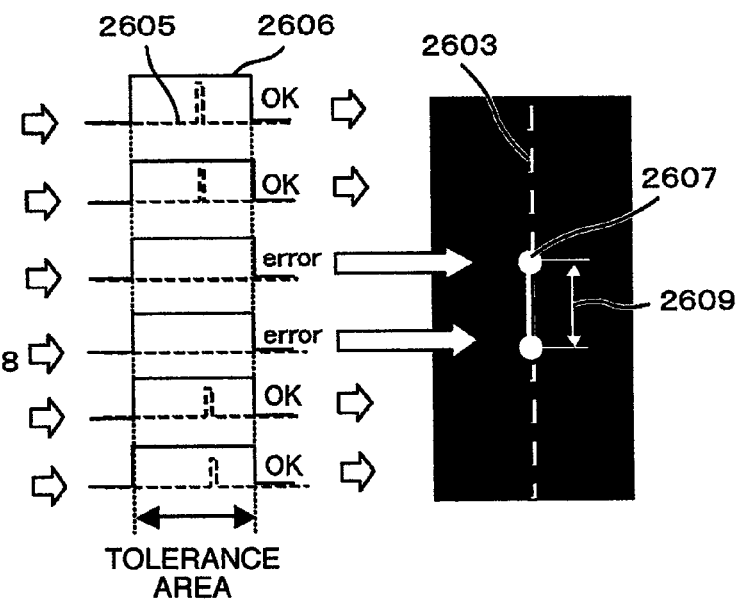
Figure 28:
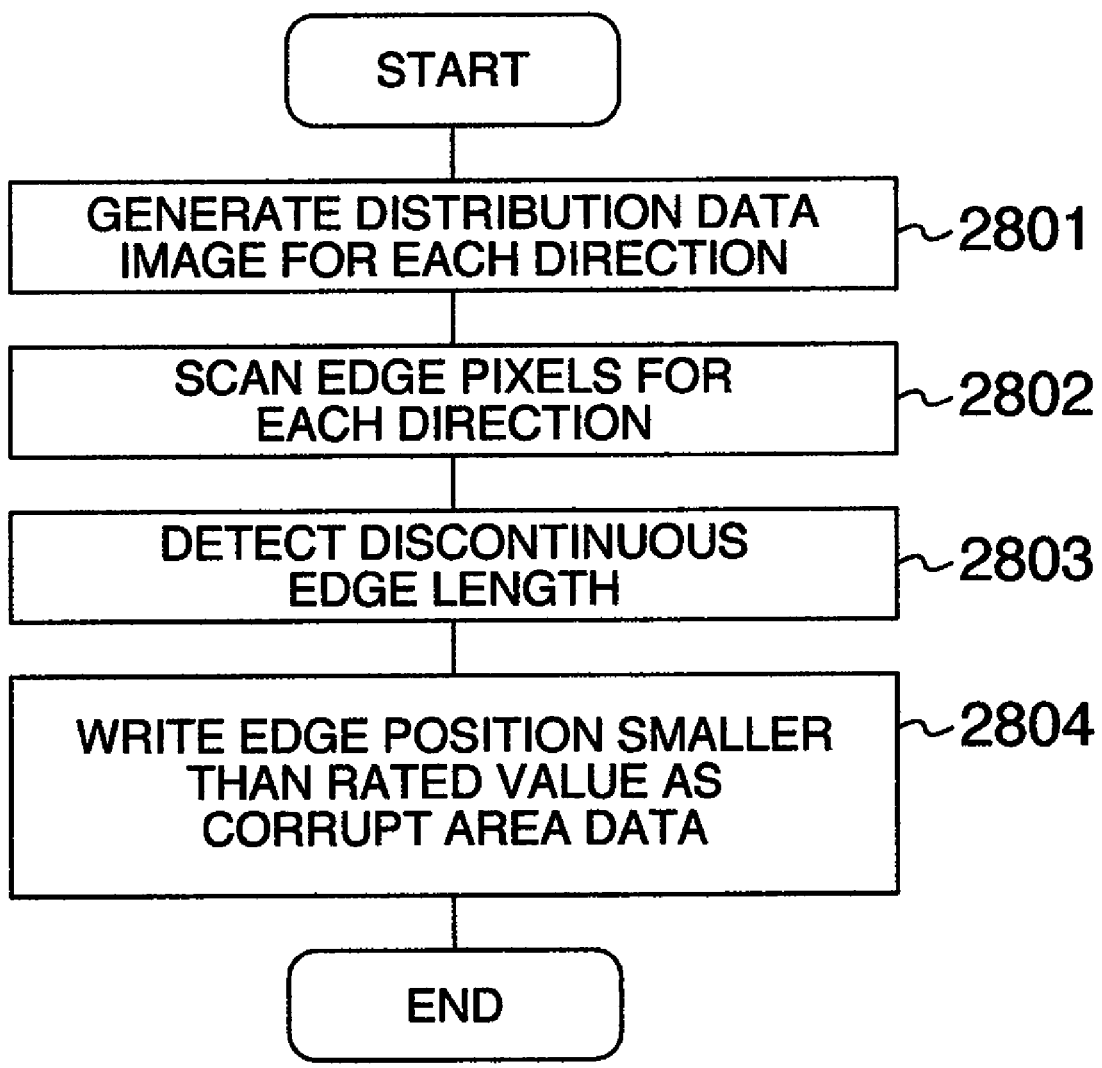
FIG. 28 is a flow chart illustrating the second detection method for a corrupt pattern.

Another method of detecting a corrupt pattern area will be described with reference to FIGS. 25A to 25A-2, FIGS. 26A to 26C and FIG. 28. FIG. 28 is a flow chart illustrating the operation to be executed by the corrupt pattern detection method B. First, by referring to pattern direction information of the direction distribution data, a plurality of sets of direction distribution data are generated indicating the tolerance area of each direction, at Step 2801. For example, generated from the direction distribution data (tolerance area 2501 and abnormal area 2502) shown in FIG. 25A are direction distribution data sets (FIG. 25A-1, hereinafter called direction distribution data A) indicating the tolerance areas in the pattern directions of 0° to 45° and 135° to 180° and direction distribution data set (FIG. 25A-2, hereinafter called direction distribution data B) indicating the tolerance areas in the pattern direction of 46° to 134°. Next, the direction distribution data A is scanned in the horizontal direction and the direction distribution data B is scanned in the vertical direction to search whether the contour data is present or absent in the normal area at Step 2802. With reference to FIGS. 26A to 26C, description will be made on a specific contour data search method. FIG. 26A is a diagram showing part of the direction distribution data in the pattern directions of 0° to 45° and 135° to 180° shown in FIG. 25A-1, and showing a tolerance area 2601, an abnormal area 2602, a pattern of design data 2603 and contour data 2604 superposed each other. Description will be made on an example of detecting a discontinuous section 2308 as a corrupt pattern area. The direction distribution data is scanned in the horizontal direction in the order of line (1) to line (6). FIG. 26B is a graph showing a presence/absence of the tolerance area, abnormal area and contour in each of the lines (1) to (6). In the lines (1), (2), (5) and (6) without a corrupt pattern, contour data exists in the tolerance area, whereas in the lines (3) and (4) with a corrupt pattern, contour data does not exist in the tolerance area. By detecting whether the contour data exists in the tolerance area during the line scanning in this manner, a pattern area 2607 of design data corresponding to the defect area of the design data 2603 corresponding to the pattern corrupt area can be identified. However, in the case wherein contour data is lost due to noises contained in a photographed image of the contour data, there is a possibility that this lost area is erroneously detected as a corrupt pattern area. To avoid this, after candidates for the corrupt pattern area are identified by the above-described method, the number of consecutive pixels of the corrupt area candidate is calculated at Step 2803, and only the area having not smaller than a rated value is judged as a corrupt pattern area, and pattern position information 2609 of the pattern area 2607 of the design data is written in the memory 0502 or disc 0506 as corrupt area data at Step 2804.

As described above, according to the present invention, through comparison between the direction distribution data and contour data, an area where a pattern which should exist is not formed can be detected as a corrupt pattern area.

(6) Sixth Embodiment

Inspection Using Contour Data of Real Pattern Image as Reference

Figure 29:
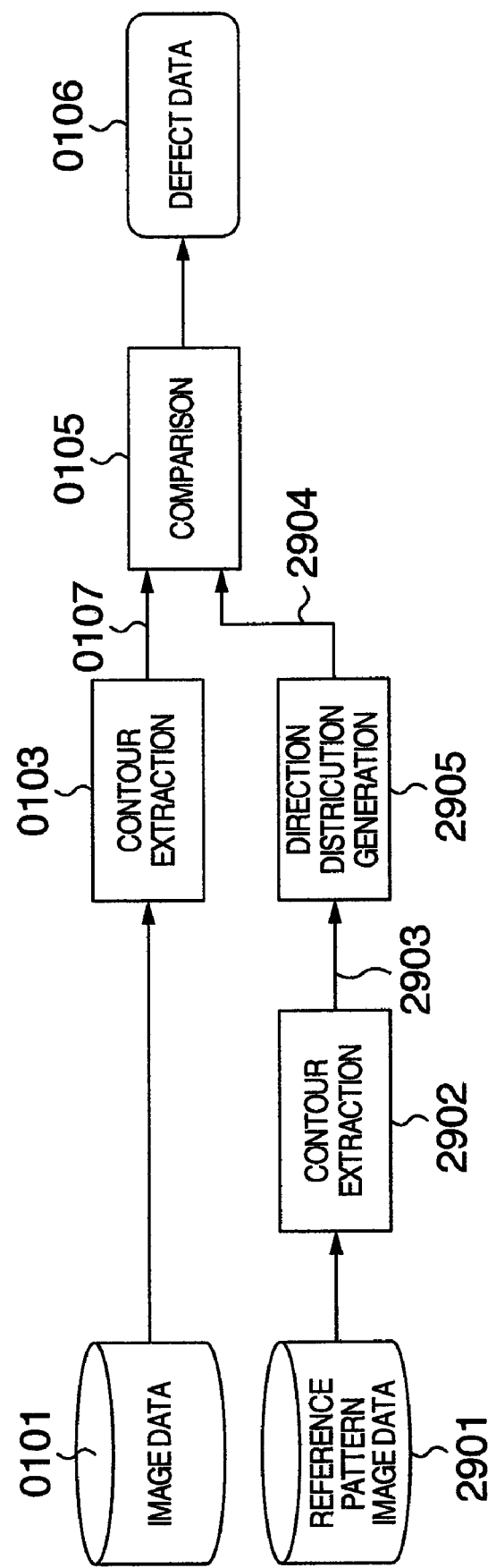
FIG. 29 is a block diagram illustrating a pattern shape evaluation method according to a sixth embodiment of the present invention.

In this embodiment, description will be made on a method of generating direction distribution data from contour data generated from a photographed pattern image and comparing the direction distribution data with contour data extracted from another photographed image, with reference to FIG. 29. In the first to fifth embodiments, the design data is used for generating the direction distribution data. There may exist an inspection style wherein a difference between semiconductor manufacture devices and a secular change are checked through comparison between a pattern shape formed normally and a pattern shape formed during actual manufacture processes. In this inspection style, it is desired to extract a pattern contour and detect an abnormal shape different from the contour shape. In this embodiment, therefore, as shown in FIG. 29, a process 2902 similar to the above-described contour extraction is performed for image data 2901 photographed from a normal pattern, to generate contour data 2903 of the normal pattern. A direction distribution unit 2905 generates direction distribution data from the contour data of the normal pattern. The direction distribution data is compared with contour data 0107 extracted from an image 0101 to be inspected to thereby detect an abnormal area or a defect area of the pattern shape.

Figure 33:
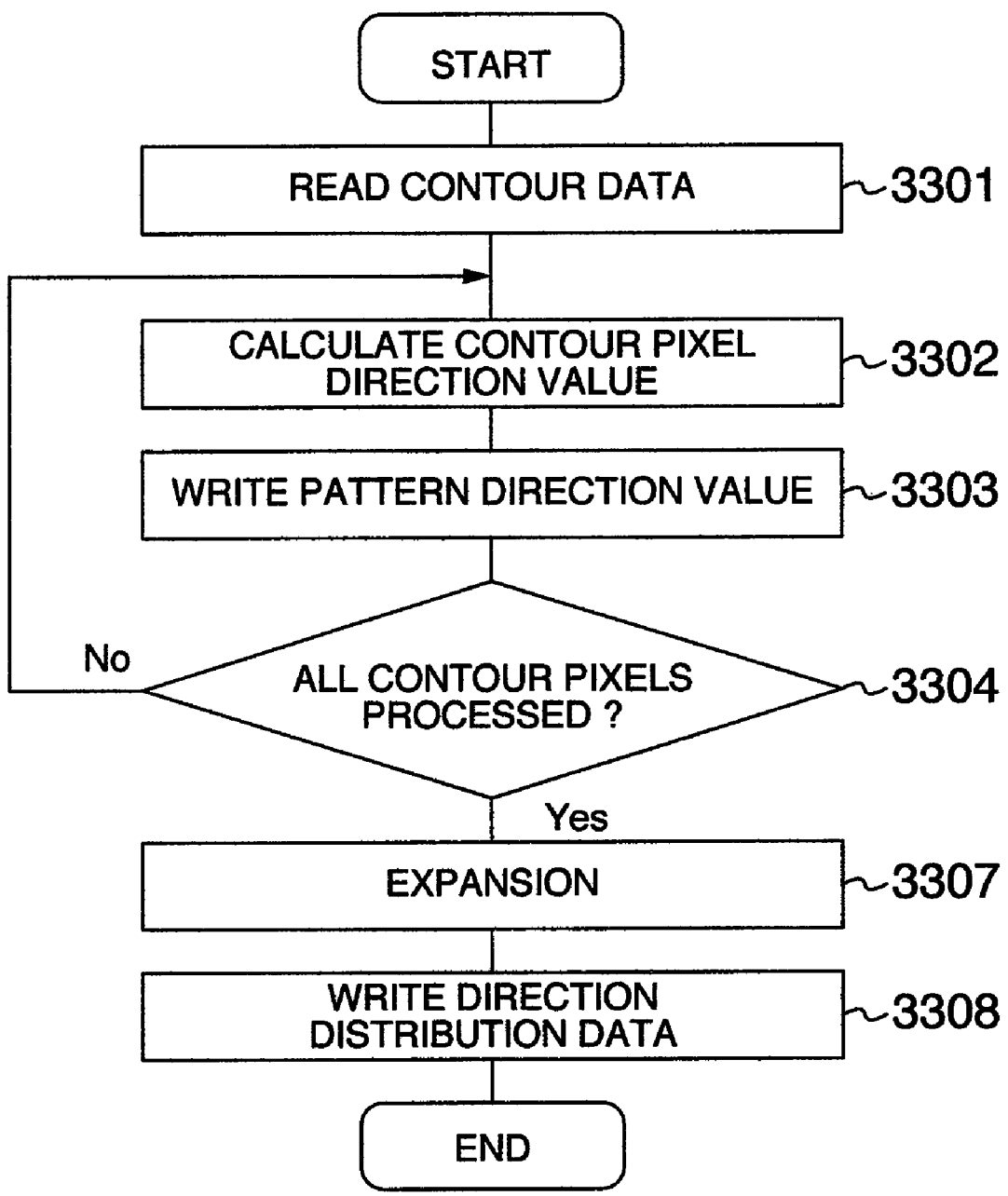
FIG. 33 is a flow chart illustrating a sequence of generating direction distribution data from an image.

The direction distribution generation unit 0104 of the first embodiment can generate direction distribution data by the sequence shown in FIG. 3. However, since the direction distribution generation unit 2905 of this embodiment uses contour data as an input, it is necessary to modify the sequences at Step 0301 to 0306 shown in FIG. 3. The flow sequence of the direction distribution unit 2905 is illustrated in FIG. 33.

First, contour data is read at Step 3301. Next, a direction value of a contour is calculated at Step 3302 for each pixel value constituting the contour data in accordance with the relation of peripheral consecutive contour pixels, and the calculated direction value is written in the memory 0502 or disc 0506 at Step 3303. The direction value of the contour can be detected by using the templates shown in FIG. 22 described in the comparison process of the first embodiment. Alternatively, by using the broken line approximation process disclosed in "Computer Image Processing" written by Hideyuki TAMURA or the like, contour data as dot train information of an image is once approximated to straight line information, and a pattern direction can be detected from inclination information of the straight line. In this manner, a pattern direction value of all contour pixels of the contour data is detected at Step 3304. Steps 0307 and 0308 after the expansion process are similar to those in the flow chart of FIG. 3, and the detailed description thereof is omitted.

As described above, according to the present invention, the direction distribution data is generated from the contour data of an actually manufactured pattern and inspected. It is therefore possible to realize inspection of an abnormal state and a defect area of a pattern shape at high precision, through comparison with the normally formed pattern shape.

(7) Seventh Embodiment

Inspection Using Contour Data of Simulation Image as Reference

In this embodiment, description will be made on a method of generating direction distribution data from contour data extracted from a manufactured pattern estimation image formed by process simulation, and comparing the direction distribution data with contour data extracted from another photographed image. In recent semiconductor development processes, it is essential to perform a work of estimating how a pattern shape of design data is formed on a wafer by manufacture process simulation and adjusting the pattern shape and layout of design data. This is because the pattern shape and layout of design data difficult to be manufactured can be prevented in advance.

Figure 30:
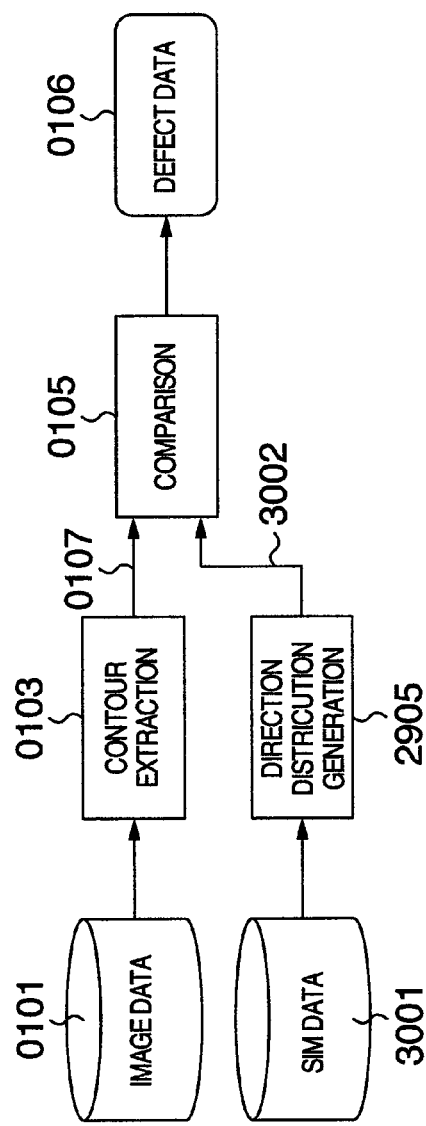
FIG. 30 is a block diagram illustrating a pattern shape evaluation method according to a seventh embodiment of the present invention.

With this inspection method, as shown in FIG. 30, direction distribution data is generated at Step 3003 from contour data 3001 of a simulation pattern formed by process simulation, and compared with contour data extracted from a photographed image of a manufactured pattern to inspect an abnormal state and a defect of a pattern relative to the simulation pattern. An input to a direction distribution generation unit 2905 is contour data of the simulation image so that it is possible to adopt the method of generating direction distribution data of the sixth embodiment.

As described above, according to the present invention, the direction distribution data is generated from the contour data of a simulation image formed by process simulation and inspected. It is therefore possible to realize inspection of an abnormal state and a defect area of a pattern shape at high precision, by using simulation data. Further, since defect data output as inspection result indicates a difference between the simulation pattern shape and an actual pattern shape, the defect data can be used also for verification of simulation performance.

(8) Eighth Embodiment

Method of Generating Measuring Recipe from Defect Information

Figure 31:
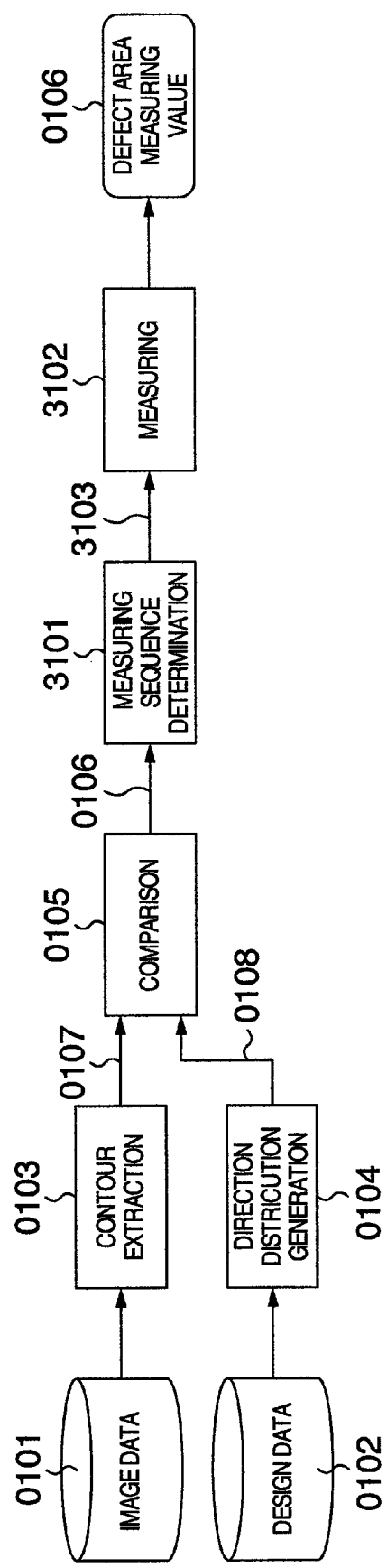
FIG. 31 is a block diagram illustrating a pattern shape evaluation method according to an eighth embodiment of the present invention.

This embodiment shows a method of, in accordance with information on an abnormal pattern shape area detected through comparison between direction distribution data and contour data, deciding a pattern measuring sequence for measuring an abnormal shape area, and measuring the abnormal shape area in accordance with the measuring sequence. As described in the first to seventh embodiments, it is possible to detect abnormal areas such as a shorted or broken pattern and a broad or narrow pattern distance, through comparison between the direction distribution data and contour data. A shorted or broken pattern is an issue to be settled at semiconductor process development stages. An abnormal pattern distance is also an issue to be settled during semiconductor mass production, and strict inter-pattern distance measurement is required in some cases for management of semiconductor processes. In this case, an inter-pattern distance in an abnormal shape area can be measured in accordance with a sequence illustrated in FIG. 31. Description will be made on the pattern measuring sequence shown in FIG. 31. Since the sequence described in the first to seventh embodiments can be used as the sequence up to detecting the defect data 0106 representative of an abnormal inter-pattern distance area, the description thereof is omitted. Data to be input to a direction distribution generation unit 0104 shown in FIG. 31 may be any one of design data, contour data generated through process simulation, and contour data extracted from a photographed image of a manufactured pattern.

A measuring sequence determining unit 3101 determines a sequence (hereinafter called measuring sequence data 3103) of measuring an abnormal shape area and inter-pattern distances between design data and the abnormal shape in accordance with the defect data 0106. More specifically, obtained from information on the abnormal shape area and design data are a measuring point, a direction along which an inter-pattern distance is measured and image photographing conditions if an image is required to be photographed again. For example, the measuring sequence determining unit corresponds to a unit for forming a measuring recipe for controlling a measuring device if difference devices are used for inspecting and measuring an abnormal shape area.

Lastly, in accordance with the measuring sequence data 3103, a measuring unit 3102 measures an inter-pattern distance to obtain measuring data 0106. Description will be made on a measuring sequence determining method and a measuring method by using a specific example.

Figure 32A:
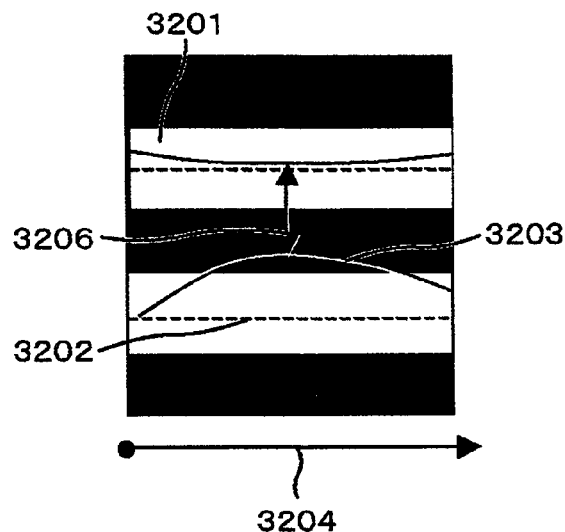
FIGS. 32A to 32D are diagrams illustrating the outline of a process of identifying a measurement point from defect data.
Figure 32B:
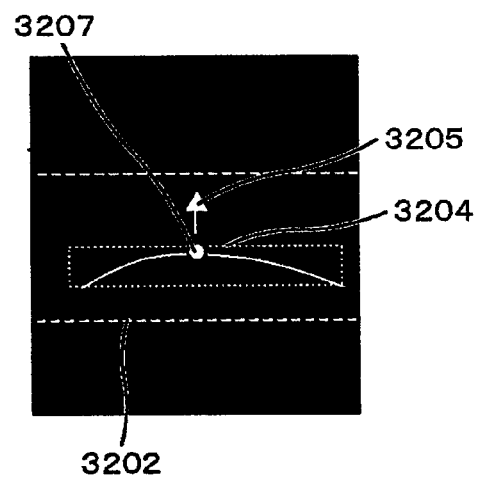
Figure 32C:
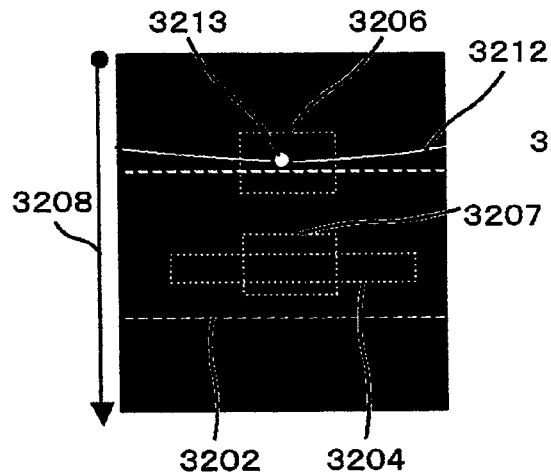
Figure 32D:
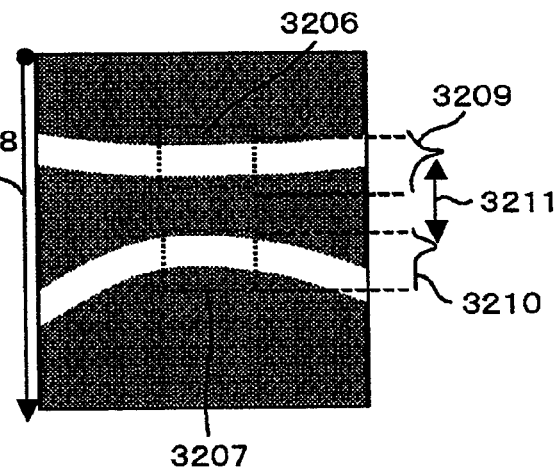

FIG. 32A is a diagram showing direction distribution data (tolerance area 3201), contour data 3203 and design data 3202 superposed each other, showing an abnormal shape area with an extremely narrow inter-line width. This area can be detected as an abnormal shape area 3204 of the direction distribution data, by the pattern shape evaluation described in the first to seventh embodiments (refer to FIG. 32B). Description will be made on two approaches to the measuring sequence determining method and measuring method of measuring a distance 3206 between adjacent patterns from the data of the abnormal shape area 3204.

(1) Measuring Distance between Contour Data

The first approach is to determine a contour position to be measured in accordance with a pattern layout state of an abnormal shape area and design data, and to measure the distance. For example, in FIG. 32A, since patterns are disposed in a horizontal direction, it can be known that a contour measuring direction is a vertical direction. Therefore, a point in the abnormal shape area 3204 remotest from the design data 3202 and a contour of an opposing pattern relative to the point are searched, and a distance therebetween is measured so that the inter-pattern distance in the abnormal shape area can be measured. A search direction 3205 of the opposing pattern becomes different depending upon whether a convex pattern or a concave pattern is measured. It is therefore desired that a user is urged to designate whether a convex pattern or a concave pattern is measured, via the mouse 0503 or keyboard 0504.

Figure 35:
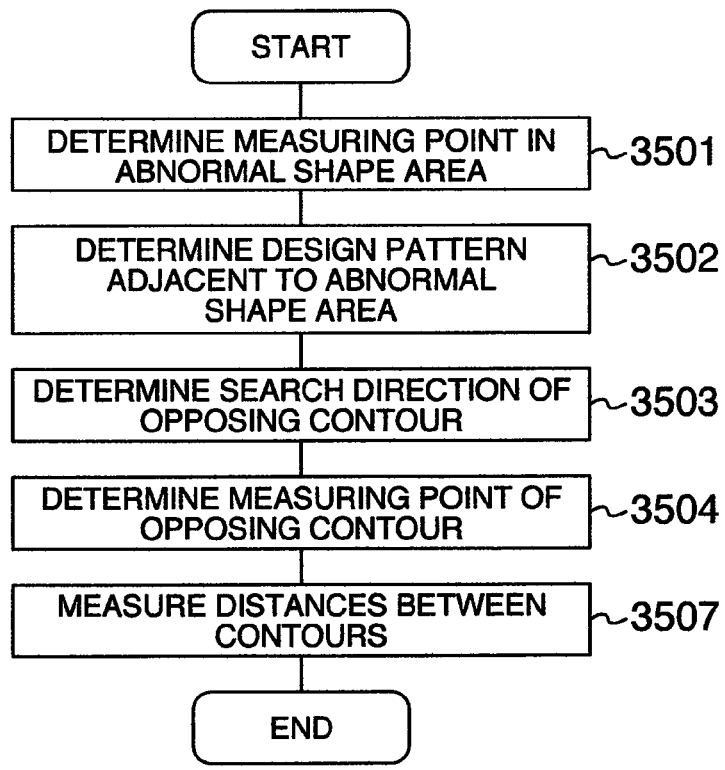
FIG. 35 is a flow chart illustrating a sequence of measuring a defect area from contour data.

FIG. 35 is a flow chart illustrating a measuring sequence generation method and a measuring method for a distance between contour data in an abnormal shape area.

First, a measuring point is determined from data of an abnormal shape area at Step 3501. For example, the measuring point is a contour position in the abnormal shape area remotest from adjacent design data. Next, a pattern of the design data nearest to the measuring point in the abnormal shape area is searched at Step 3502. At Step 3503 a direction of the pattern of the design data is detected to determine a direction along which the opposing contour as another measuring point exists. For example, if a pattern of the design data is continuous in the horizontal direction, the opposing contour should exist along the vertical direction. Next, a contour is searched along the direction along which the opposing contour exists to determine the measuring point of the opposing contour at Step 3504. Lastly, at Step 3507 a distance is measured between the measuring point in the abnormal shape area and the measuring point of the opposing contour detected by search. If a distance between the measuring point in the abnormal shape area and the design data pattern detected at Step 3502 is measured, a shape deformation amount of the pattern relative to the design data can be obtained.

(2) Measuring Inter-pattern Distance Using Photographed Pattern Image

The second approach is to measure an abnormal shape area at high precision from information on the abnormal pattern area and a photographed pattern image, by using a pattern length measuring method. If an extraction position precision of contour data to be used for pattern shape evaluation is low, the first approach is associated with a measurement precision problem. By using the pattern length measuring method, a pattern can be measured at high precision.

Figure 34:
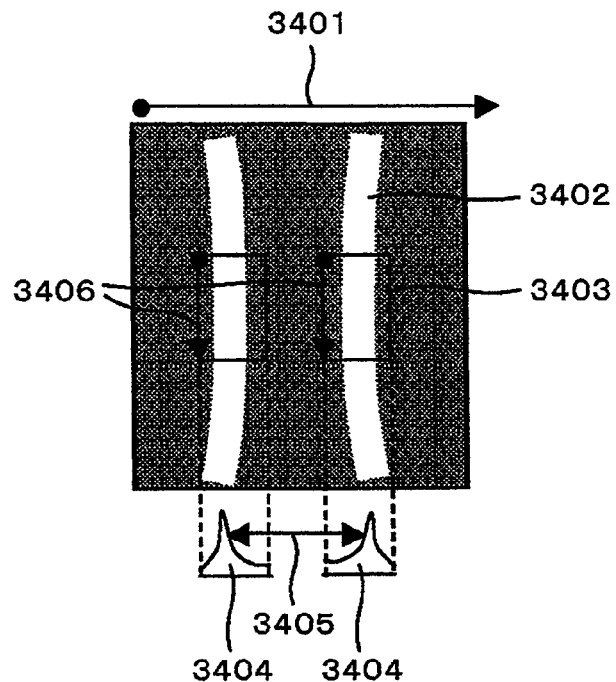
FIG. 34 is a diagram illustrating a general pattern measurement method.

The pattern length measuring method is a high precision pattern measuring method adopted by length measuring SEM mainly used for pattern line width management. FIG. 34 illustrates the outline of a pattern length measuring method and shows an image of a pattern photographed with a SEM. SEM images a sloped portion and a projecting portion of an object as white stripe image information. Therefore, by measuring a distance between white stripes, a pattern can be measured. However, random noises are superposed upon a SEM image because of SEM device characteristics. In order to increase an S/N ratio of a measuring point, a length measuring box 3403 is disposed on a pattern to be measured, a luminance value of each pixel in the length measuring box is integrated along a pattern direction to form a line profile 3404, and thereafter a length line profile 3405 is measured between peaks, or between points corresponding to a predetermined threshold value at the sloped portion. Since SEM has a high resolution along a scan direction, if the pattern exists along a vertical direction as shown in FIG. 34, an image scanned in the horizontal direction as scan direction 3401 is used.

In order to adopt the pattern length measuring method of measuring a pattern in an abnormal shape area, the measuring sequence data becomes necessary including (1) a position of a measuring pattern (a layout of the length measuring box), (2) a size of the line measuring box and (3) a scan direction.

Figure 36:
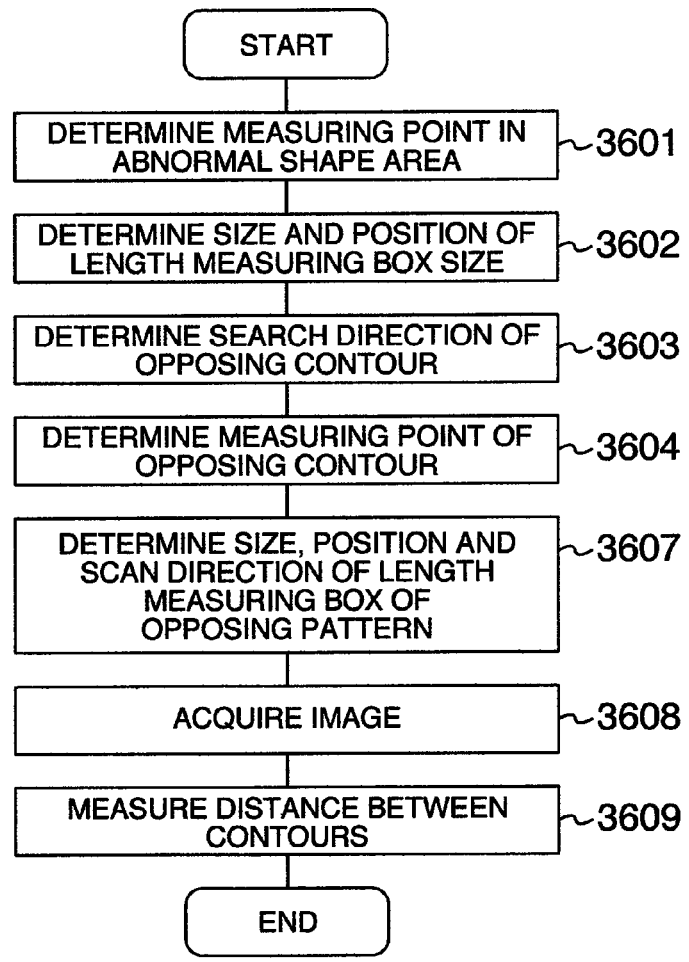
FIG. 36 is a flow chart illustrating a sequence of measuring a defect area from image data.
Figure 37A:
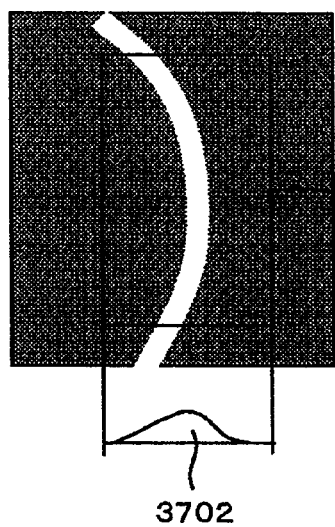
FIGS. 37A and 37B are diagrams illustrating a relation between a defect shape and a measuring box size.
Figure 37B:
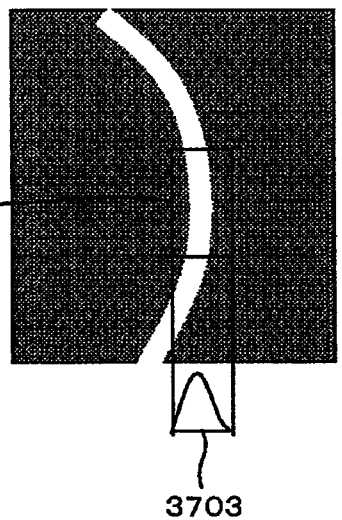

With reference to FIGS. 32A to 32D, a sequence of generating the measuring sequence data will be described. FIG. 36 is a flow chart illustrating an operation of a measuring sequence method. First, an abnormal shape area 3204 is detected through comparison between the direction distribution data and contour data, and thereafter, similar to the first approach, a measuring point 3207 is determined from the data of the abnormal shape area at Step 3601. The measuring point is, for example, a contour point in the abnormal shape area remotest from adjacent design data. Since the length measuring box is disposed surrounding the measuring point 3207, the measuring point indicates a rough position of the length measuring box. Next, in accordance with a contour shape of the abnormal shape area existing around the measuring point 3207, a size and position of the length measuring box in the abnormal shape area is determined at Step 3602. The length measuring box is used for integrating a luminance value of each pixel along a pattern direction. Therefore, for example, as shown in FIG. 37A, if a pattern is deformed greatly and a large size length measuring box is disposed, a line profile 3702 as an integration result becomes broad, posing a problem that an incorrect point is measured. By adjusting the size of the length measuring box in accordance with the pattern deformation such as shown in FIG. 37B, a line profile 3703 can be suppressed from being broadened so that correct measurement can be performed.

Figure 38:
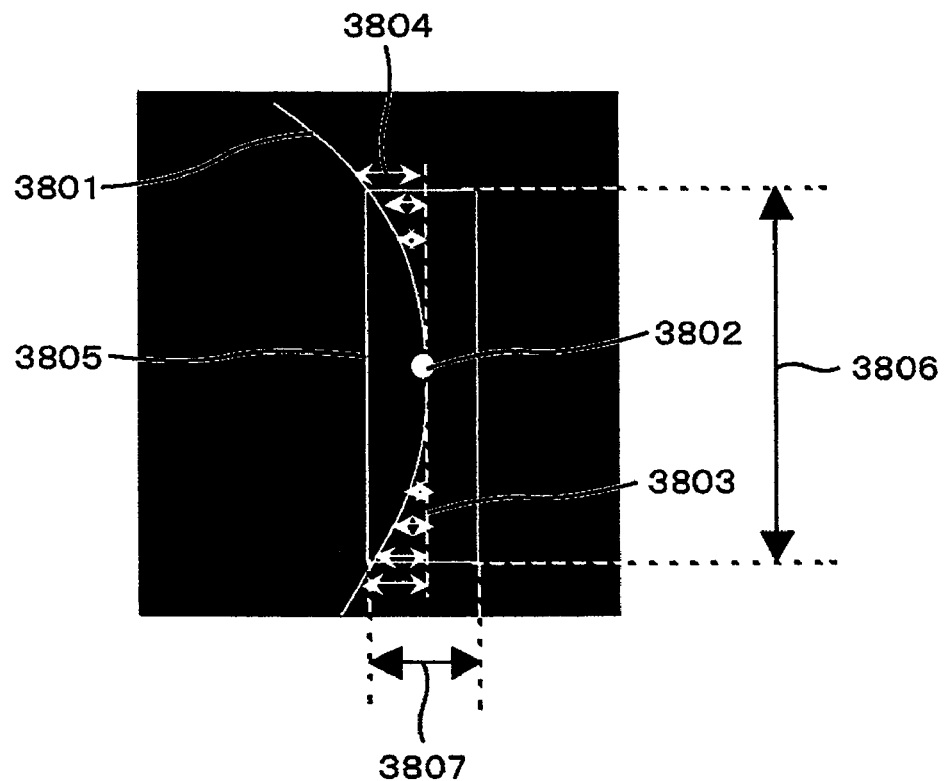
FIG. 38 is a diagram showing the outline of determining a measuring box size from a defect shape.

The size of the length measuring box in the abnormal shape area can be determined from a contour shape, by measuring distances between a straight line centering the abnormal shape area and a nearby contour. This will be described with reference to FIG. 38. First, a straight line 3803 is drawn passing a length measuring point 3802 in the abnormal shape area selected from a contour line 3801 in the abnormal shape area. A straight line direction is the same direction as the pattern direction of adjacent design data. Next, distances between the contour positions and straight line are measured in a range not larger than the maximum size of the length measuring box size, by using the length measuring point in the abnormal shape area as a center. A length of contour positions having a distance to the straight line not larger than a rated value is set to a height 3806 (relative to the pattern direction) of a length measuring box 3805. A width 3807 (relative to the pattern direction) of the length measuring box is set to a target value of a twofold of the rated value. However, if an adjacent contour is mixed in the length measuring box, the measuring box size is reduced in order to avoid erroneous detection of the measuring point. Rated values to be used for judging the maximum/minimum range of the length measuring box and a distance between the contour and straight line are desired to be designated by a user via the mouse 0503 and keyboard 0504.

Next, a measuring point of an opposing pattern in the abnormal shape area is determined. By using the method described in the first approach, a search direction 3205 (FIG. 32B) of the opposing pattern is obtained at Step 3603, and an opposing contour 3212 is searched to determine a measuring point 3213 on the opposing contour at Step 3604. A position and size of a length measuring box 3206 of the opposing pattern is determined by using the measuring point 3213 as a center. The method of determining the position and size of the length measuring box 3206 is fundamentally the same as the method of determining the position and size of the length measuring box in the abnormal shape area. If a search direction 3205 of the opposing pattern is different from the scan direction of a photographed pattern image, the image scan direction is determined as the search direction 3205 to photograph an image by changing the scan direction.

Next, if it becomes necessary to photograph an image again because the pattern measuring direction and the scan direction are different or the device for pattern shape evaluation is different from a pattern measuring device, an image of a pattern in the abnormal shape area to be measured is photographed at Step 3608. This image is photographed in accordance with the measuring sequence data of position information of the abnormal shape area and a scan direction determined by the above-described sequence. Positioning a pattern to be measured can be realized through pattern matching with the photographed image by forming templates of the design data near the pattern. In accordance with the positioning result and the measuring sequence data of the position and size of the length measuring box, the length measuring box 3206 is disposed on the image. Finally, a line profile 3210 of the abnormal shape area and a line profile 3209 of the opposing pattern are generated, and a distance 3211 between points of the profiles is measured to obtain a pattern distance in the abnormal shape area at Step 3609.

As described above, according to the present invention, the measuring sequence data for measuring a distance between patterns in the abnormal shape area is generated from information (position and shape) on the abnormal shape area of the pattern detected through comparison between the direction distribution data and contour data, and a distance between patterns is measured. It is therefore possible to correctly measure the distance between patterns in the abnormal shape area necessary for management of semiconductor processes.

The present invention described so far can be applied to a pattern shape evaluation method and a semiconductor inspection system of inspecting a defect position of a pattern formed on a photomask or wafer at high speed.

It should be further understood by those skilled in the art that although the foregoing description has been made on embodiments of the invention, the invention is not limited thereto and various changes and modifications may be made without departing from the spirit of the invention and the scope of the appended claims.

The invention claimed is:

1. A pattern shape evaluation method, comprising steps of:
generating a tolerance area of a normal pattern of an electronic device according to a plurality of lines constituting the normal pattern for each of a plurality of directions, in accordance with: pattern data based on design data of the electronic device, pattern data based on a photographed image or pattern data based on a process simulation;
extracting contour data of a pattern of the electronic device from an image obtained by photographing a circuit pattern of the electronic device; and
detecting a portion of the contour data as representing a defect of the pattern of the electronic device, when the portion of the contour data corresponding to the tolerance area does not satisfy a predetermined direction condition relative to the tolerance area of the normal pattern.

2. The pattern shape evaluation method according to claim 1, wherein
when the contour data of the pattern is extracted from the image of the circuit pattern, contour pixels of the pattern are detected from the image of the circuit pattern in a pixel unit or a subpixel unit, and
the contour data include new contour pixels obtained through an approximation process for adjacent contour pixels.

3. The pattern shape evaluation method according to claim 1, wherein when the defect of the pattern is to be detected, a portion of pattern direction data of the contour data outside a predetermined range of angle is judged as a defect of the pattern.

4. The pattern shape evaluation method according to claim 3, wherein
pattern direction data related to the normal pattern include pattern direction range data, and
when the defect of the pattern is to be detected and when the pattern direction data of the contour data, representing an area of the pattern, is outside a pattern direction range defined by the pattern direction range data, the area of the pattern is judged as a defect area.

5. The pattern shape evaluation method according to claim 4, further comprising a step of judging a defect type of the defect area from a state of a particular pattern of one of the design data of the electronic device, the image obtained by photographing the circuit pattern of the electronic device, and pattern shape data obtained through a process simulation, the particular pattern being located at a position of the defect area.

6. The pattern shape evaluation method according to claim 1, wherein
when the defect of the pattern is to be detected, a pattern position represented by the contour data is compared with pattern shape range data generated from the design data of the electronic device, and
when the pattern position represented by the contour data is outside a pattern shape range defined by the pattern shape range data, an area represented by the contour data, that is outside the pattern shape range is judged as a defect of the pattern.

7. The pattern shape evaluation method according to claim 1, wherein a defect having a continuous contour is detected from a pattern defect, and an area containing the defect having the continuous contour is detected as a defect area.

8. The pattern shape evaluation method according to claim 1, further comprising steps of:
detecting a contour having an opposing relation from a pattern defect, and
detecting an area including the contour having the opposing relation as a defect area.

9. A pattern shape evaluation device, comprising:
means for generating a tolerance area of a normal pattern of an electronic device according to a plurality of lines constituting the normal pattern for each of a plurality of directions, in accordance with: pattern data based on design data of the electronic device, pattern data based on a photographed image or pattern data based on a process simulation;
means for extracting contour data of a pattern of the electronic device from an image obtained by photographing a circuit pattern of the electronic device; and
means for detecting a portion of the contour data as representing a defect of the pattern of the electronic device, when the portion of the contour data corresponding to the tolerance area does not satisfy a predetermined direction condition relative to the tolerance area of the normal pattern.

10. A semiconductor inspection system, comprising:
the pattern shape evaluation device according to claim 9; and
a computer equipped with a scanning electron microscope and control means for the scanning electron microscope.

11. The pattern shape evaluation device according to claim 9, wherein the means for detecting a defect of the pattern includes means for detecting a discontinuous area represented by the contour data as a defect area of the pattern, through comparison of pattern shape range data generated from the design data of the electronic device, pattern direction data related to the normal pattern and the contour data.

12. The pattern shape evaluation device according to claim 11, wherein the means for detecting a defect of the pattern includes means for measuring a length of the discontinuous area, and judges a further defect of the pattern through comparison of the measured length with a threshold value of a defect size designated by a user.

13. The pattern shape evaluation device according to claim 9, further comprising means for generating measuring sequence data for measuring a pattern area corresponding to the detected defect, in accordance with defect data representing the detected defect.

14. The pattern shape evaluation device according to claim 13, wherein the measuring sequence data generating means determines a scan direction of a particular image to be used for measurement, in accordance with:
coordinate information of the defect data, or
shape information on pattern shape data extracted from the design data and representing an area adjacent to the detected defect or extracted from an image obtained by photographing the circuit pattern of the electronic device, or
shape information on pattern shape data obtained through a process simulation.

15. The pattern shape evaluation device according to claim 13, wherein the measuring sequence data generating means determines two measuring points including coordinate data of the defect data in accordance with:
coordinate information of the defect data, or
shape information on pattern shape data extracted from the design data and representing an area adjacent to the detected defect or extracted from an image obtained by photographing the circuit pattern of the electronic device, or
shape information on pattern shape data obtained through a process simulation.

16. The pattern shape evaluation device according to claim 13, wherein the measuring sequence data generating means determines two measuring points including coordinate data of the defect data and determines a rectangle area, a rectangle size, and a line integration direction for generating a line profile at each of the two measurement points through line integration, in accordance with:
coordinate information of the defect data, or
shape information on pattern shape data extracted from the design data and representing an area adjacent to the detected defect or extracted from an image obtained by photographing the circuit pattern of the electronic device, or
shape information on pattern shape data obtained through process simulation.

17. The pattern shape evaluation device according to claim 16, wherein the rectangle size is determined from a pattern shape of the defect data.

18. The pattern shape evaluation device according to claim 13, wherein in accordance with the measuring sequence data, the measuring sequence data generating means photographs an image of a defect area, measures the defect area, and measures a distance between the defect area and a closest pattern represented by pattern shape data extracted from the design data or an image obtained by photographing the circuit pattern of the electronic device or pattern shape data obtained through a process simulation.

19. The pattern shape evaluation device according to claim 13, wherein the measuring sequence data generating means determines two measuring points on the contour data including coordinate data of the defect data and measures a distance between the two measuring points, in accordance with:
coordinate information of the defect data, or
shape information on pattern shape data extracted from the design data and representing an area adjacent to the detected defect data or extracted from an image obtained by photographing the circuit pattern of the electronic device or
shape information on pattern shape data obtained through a process simulation.

* * * * *